(12) United States Patent
Lee et al.

(10) Patent No.: US 12,500,968 B2
(45) Date of Patent: Dec. 16, 2025

(54) DISPLAY DEVICE

(71) Applicant: Samsung Display Co., Ltd., Yongin-si (KR)

(72) Inventors: Kyunghoe Lee, Yongin-si (KR);
Heerim Song, Yongin-si (KR);
Cheol-Gon Lee, Yongin-si (KR);
Mukyung Jeon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 219 days.

(21) Appl. No.: 18/363,105

(22) Filed: Aug. 1, 2023

(65) Prior Publication Data
US 2024/0137432 A1 Apr. 25, 2024
US 2024/0236219 A9 Jul. 11, 2024

(30) Foreign Application Priority Data
Oct. 20, 2022 (KR) ........................ 10-2022-0135932

(51) Int. Cl.
*H04M 1/02* (2006.01)
*G09G 3/3258* (2016.01)

(52) U.S. Cl.
CPC ........ *H04M 1/0266* (2013.01); *G09G 3/3258* (2013.01)

(58) Field of Classification Search
None
See application file for complete search history.

(56) References Cited

U.S. PATENT DOCUMENTS

| | | | |
|---|---|---|---|
| 12,177,985 B2* | 12/2024 | Lee | H05K 13/0815 |
| 2017/0047356 A1* | 2/2017 | Lee | H10D 86/60 |
| 2018/0033801 A1* | 2/2018 | Koide | G06F 3/0446 |
| 2020/0091268 A1 | 3/2020 | Cho et al. | |
| 2020/0319729 A1* | 10/2020 | Yang | G06F 3/04164 |
| 2021/0181916 A1* | 6/2021 | Kwon | H10K 59/40 |
| 2022/0320247 A1* | 10/2022 | Liu | H01L 21/77 |
| 2024/0057397 A1* | 2/2024 | Ryu | H10K 59/131 |
| 2024/0079365 A1* | 3/2024 | Han | H01L 24/30 |
| 2024/0203318 A1* | 6/2024 | Han | G09G 3/2096 |
| 2024/0203365 A1* | 6/2024 | Lee | G09G 3/3291 |
| 2025/0081776 A1* | 3/2025 | Park | H10K 59/122 |

FOREIGN PATENT DOCUMENTS

| | | |
|---|---|---|
| CN | 111176486 | 5/2020 |
| KR | 10-2018-0069623 | 6/2018 |
| KR | 10-2019-0068112 | 6/2019 |
| KR | 10-2020-0032302 | 3/2020 |

* cited by examiner

*Primary Examiner* — Parul H Gupta

(57) ABSTRACT

A display device includes a display panel, and a circuit film disposed under the display panel. The display panel includes a base layer, pixels disposed on the base layer, sensors disposed on the base layer, first connection lines disposed on the base layer and electrically connected to the pixels, second connection lines disposed on the base layer and electrically connected to the sensors, first pads electrically connected to the first connection lines, and second pads electrically connected to the second connection lines. The circuit film is electrically connected to the first pads and the second pads through an opening of the base layer, and each of the plurality of second connection lines has a straight shape extending along a first direction.

20 Claims, 20 Drawing Sheets

DISPLAY DEVICE

CROSS-REFERENCE TO RELATED APPLICATION(S)

This application claims priority to and benefits of Korean Patent Application No. 10-2022-0135932 under 35 U.S.C. § 119, filed on Oct. 20, 2022, in the Korean Intellectual Property Office, the entire contents of which are incorporated herein by reference.

BACKGROUND

1. Technical Field

Embodiments described herein relate to a display device having improved sensing sensitivity.

2. Description of the Related Art

A display device provides various functions to organically communicate with a user, such as displaying an image to provide information to the user or detecting a user's input. The display device performs a function for detecting information (e.g., biometric information) provided from the user. A scheme for recognizing the user information includes a capacitance based scheme that detects change in capacitance generated between electrodes, a light based scheme that detects incident light by using a light sensor, an ultrasonic based scheme that detects vibration by using a piezoelectric material, etc.

SUMMARY

Embodiments provide a display device capable of improving sensing sensitivity.

However, embodiments of the disclosure are not limited to those set forth herein. The above and other embodiments will become more apparent to one of ordinary skill in the art to which the disclosure pertains by referencing the detailed description of the disclosure given below.

According to an embodiment, a display device may include a display panel, and a circuit film disposed under the display panel, wherein the display panel may include a base layer, a plurality of pixels disposed on the base layer, a plurality of sensors disposed on the base layer, a plurality of first connection lines disposed on the base layer and electrically connected to the plurality of pixels, a plurality of second connection lines disposed on the base layer and electrically connected to the plurality of sensors, a plurality of first pads electrically connected to the plurality of first connection lines, and a plurality of second pads electrically connected to the plurality of second connection lines, the circuit film may be electrically connected to the plurality of first pads and the plurality of second pads through an opening of the base layer, and each of the plurality of second connection lines may have a straight shape extending along a first direction.

The plurality of second connection lines may be spaced from each other by a same distance.

The plurality of first connection lines may not overlap the plurality of second connection lines in a plan view.

The plurality of first connection lines may include a plurality of straight portions extending along the first direction.

The plurality of straight portions of the plurality of first connection lines and the plurality of second connection lines may be arranged along a second direction intersecting the first direction and may be spaced from each other by a same distance.

N straight portions of the plurality of first connection lines, one second connection line of the plurality of second connection lines, and N straight portions of the plurality of first connection lines may be sequentially and repeatedly arranged along a second direction intersecting the first direction, where N may be a positive integer of 2 or greater.

The plurality of second connection lines may be disposed on a different layer from a layer on which the plurality of first connection lines are disposed.

The display panel may further include a voltage line overlapping the plurality of first connection lines and the plurality of second connection lines.

The voltage line may be disposed between the plurality of first connection lines and the plurality of second connection lines in a cross-sectional view.

The voltage line may include a first sub-voltage line and a second sub-voltage line electrically connected to each other, the second sub-voltage line may be disposed on a different layer from a layer on which the first sub-voltage line is disposed, and the plurality of second connection lines may be disposed between the first sub-voltage line and the second sub-voltage line.

The base layer may include a first sub-base layer and a second sub-base layer disposed on the first sub-base layer, the plurality of first pads and the plurality of second pads may be disposed between the first sub-base layer and the second sub-base layer, and a portion of the first sub-base layer may be removed to form the opening of the base layer exposing the plurality of first pads and the plurality of second pads.

The display panel may further include a plurality of first extension lines electrically connected to the plurality of first pads and disposed on a same layer as a layer on which the plurality of first pads are disposed, a plurality of second extension lines electrically connected to the plurality of second pads and disposed on a same layer as a layer on which the plurality of second pads are disposed, a plurality of first contact lines electrically connecting the plurality of first extension lines and the plurality of first connection lines to each other, and a plurality of second contact lines electrically connecting the plurality of second extension lines and the plurality of second connection lines to each other.

The plurality of first contact lines may be respectively connected to the plurality of first extension lines via a plurality of first contacts, and the plurality of second contact lines may be respectively connected to the plurality of second extension lines via a plurality of second contacts, and a size of each of the plurality of second contacts may be greater than a size of each of the plurality of first contacts.

The plurality of first contact lines and the plurality of second contact lines may be disposed on a same layer, wherein the plurality of first contact lines may be disposed on a different layer from a layer on which the plurality of first connection lines are disposed, and the plurality of second contact lines may be disposed on a different layer from a layer on which the plurality of second connection lines are disposed.

The plurality of first pads and the plurality of second pads may be arranged along a second direction intersecting the first direction and may be spaced from each other by a same distance.

The display panel may further include a plurality of third pads disposed on a same layer as a layer on which the plurality of first pads and the plurality of second pads are disposed, and the plurality of first pads, the plurality of second pads, and the plurality of third pads may be arranged along a second direction intersecting the first direction and may be spaced from each other by a same distance.

According to an embodiment, a display device may include a base layer including a first sub-base layer and a second sub-base layer disposed on the first sub-base layer, a plurality of pixels disposed on the base layer, a plurality of sensors disposed on the base layer, a plurality of first connection lines electrically connected to the plurality of pixels, a plurality of second connection lines electrically connected to the plurality of sensors, a plurality of first pads disposed between the first sub-base layer and the second sub-base layer, and respectively electrically connected to the plurality of first connection lines, a plurality of second pads disposed between the first sub-base layer and the second sub-base layer, and respectively electrically connected to the plurality of second connection lines, and a circuit film disposed under the base layer and coupled to the plurality of first pads and the plurality of second pads through an opening of the first sub-base layer, wherein the plurality of second connection lines are spaced from each other by a same distance.

Each of the plurality of second connection lines may have a straight shape extending along a first direction, and the plurality of first connection lines may not overlap the plurality of second connection lines in a plan view.

The plurality of first connection lines may respectively include a plurality of straight portions extending along a first direction, and the plurality of straight portions and the plurality of second connection lines may be arranged along a second direction intersecting the first direction and may be spaced from each other by a same distance in a plan view.

The display device may further include a voltage line overlapping the plurality of first connection lines and the plurality of second connection lines in a plan view, wherein the voltage line may be disposed between the plurality of first connection lines and the plurality of second connection lines in a cross-sectional view.

BRIEF DESCRIPTION OF THE DRAWINGS

The above and other objects and features of the disclosure will become apparent by describing in detail embodiments thereof with reference to the accompanying drawings.

DETAILED DESCRIPTION OF THE EMBODIMENTS

Figure 1:
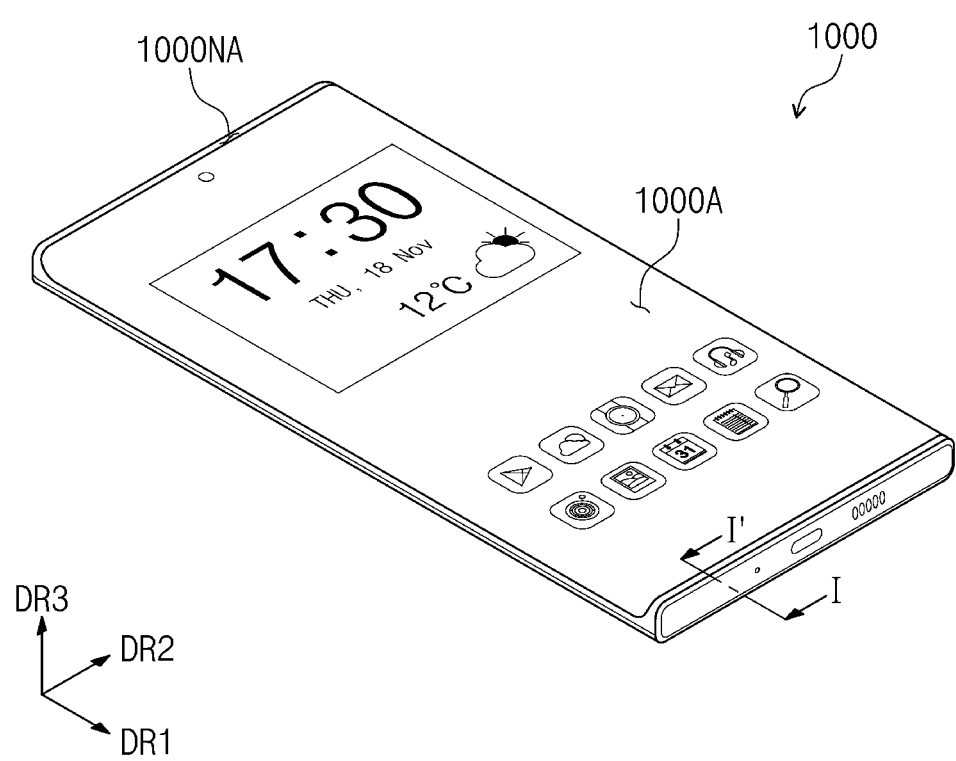
FIG. 1 is a schematic perspective view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, embodiments will be described with reference to drawings.

FIG. 1 is a schematic perspective view of a display device 1000 according to an embodiment.

Referring to FIG. 1, the display device 1000 may be a device activated according to an electrical signal. For example, the display device 1000 may be a mobile phone, a foldable mobile phone, a laptop computer, a television, a tablet, a car navigation system, a game console, or a wearable device. However, embodiments are not limited thereto. FIG. 1 shows that the display device 1000 is a mobile phone as an example.

In the display device 1000, an active area 1000A and a peripheral area 1000NA may be defined. The display device 1000 may display an image on the active area 1000A. The active area 1000A may include a plane defined by a first direction DR1 and a second direction DR2. The peripheral area 1000NA may surround the active area 1000A.

A thickness direction of the display device 1000 may be parallel to a third direction DR3 intersecting the first direction DR1 and the second direction DR2. Accordingly, a front surface (or a top surface or an upper surface) and a rear surface (or a bottom surface or a lower surface) of each of members of the display device 1000 may be defined in the third direction DR3.

Figure 2:
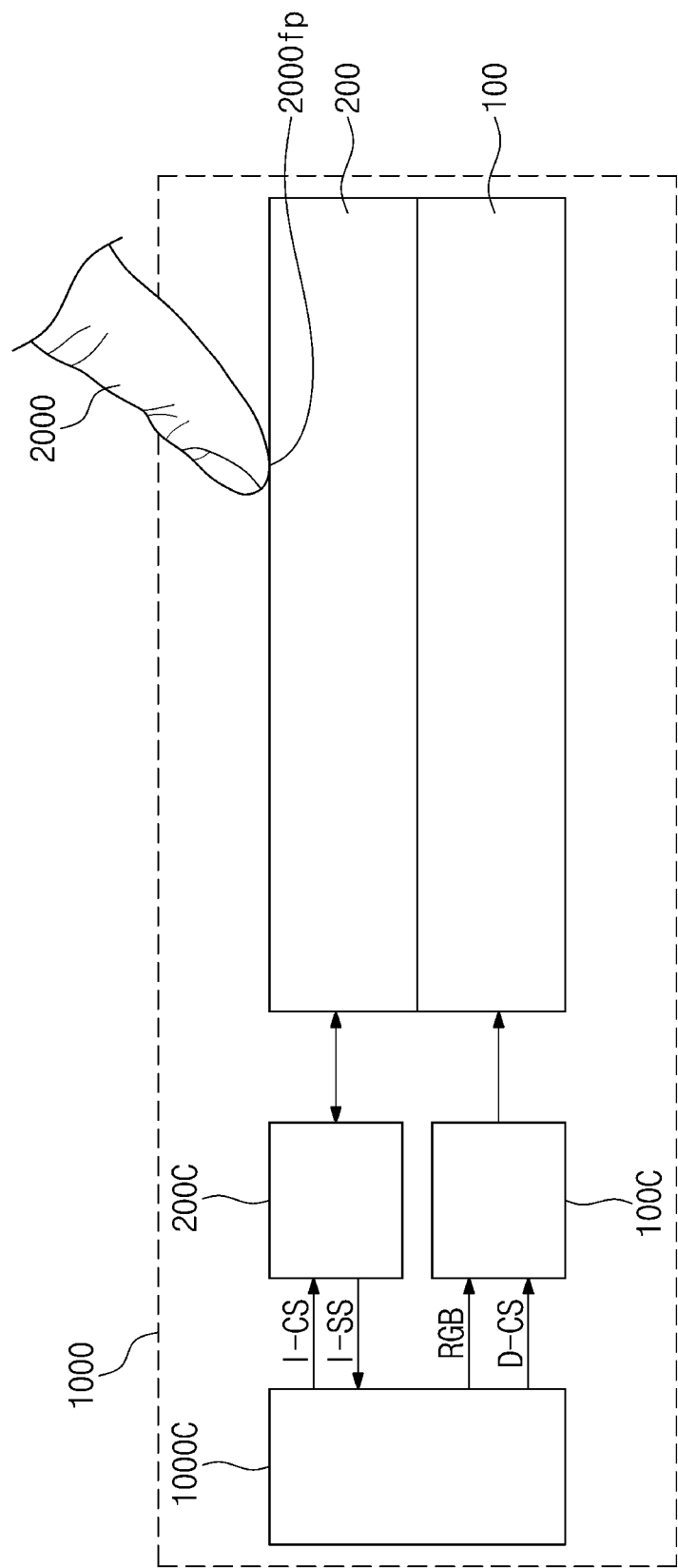
FIG. 2 is a schematic block diagram of a display device according to an embodiment.

FIG. 2 is a block diagram of the display device 1000 according to an embodiment.

Referring to FIG. 2, the display device 1000 may include a display panel 100, a sensor layer 200, a display driver 100C, a sensor driver 200C, and a main driver 1000C.

The display panel 100 may be a component that substantially generates an image. The display panel 100 may be a light-emitting display layer. For example, the display panel 100 may include an organic light-emitting display layer, an inorganic light-emitting display layer, an organic-inorganic light-emitting display layer, a quantum dot display layer, a micro light-emitting diode (LED) display layer or a nano LED display layer. Further, the display panel 100 may include a sensor that is capable of sensing the light reflected from the user's fingerprint 2000fp or reacting with the light.

The sensor layer 200 may be disposed on the display panel 100. The sensor layer 200 may detect an external input 2000 applied from an outside. The external input 2000 may include all input means that cause a change in capacitance. For example, the sensor layer 200 may sense not only an input from passive type input means such as a user's body, but also an input from active type input means that provides a drive signal.

The main driver 1000C may control overall operations of the display device 1000. For example, the main driver 1000C may control an operation of each of the display driver 100C and the sensor driver 200C. The main driver 1000C may include at least one micro processor, and may further include a graphic controller. The main driver 1000C may be referred to as an application processor, a central processing unit (CPU), or a main processor.

The display driver 100C may drive the display panel 100. The display driver 100C may receive image data RGB and a control signal D-CS from the main driver 1000C. The control signal D-CS may include various signals. For example, the control signal D-CS may include an input vertical synchronization signal, an input horizontal synchronization signal, a main clock, and a data enable signal. The display driver 100C may generate a vertical synchronization signal and a horizontal synchronization signal to control a timing at which a signal is supplied to the display panel 100, based on the control signal D-CS.

The sensor driver 200C may drive the sensor layer 200. The sensor driver 200C may receive a control signal I-CS from the main driver 1000C. The control signal I-CS may include a clock signal.

The sensor driver 200C may calculate coordinate information of the input based on a signal received from the sensor layer 200 and provide a coordinate signal I-SS having the coordinate information to the main driver 1000C. The main driver 1000C executes an operation corresponding to the user input based on the coordinate signal I-SS. For example, the main driver 1000C may operate the display driver 100C to display a new application image on the display panel 100.

Figure 3:
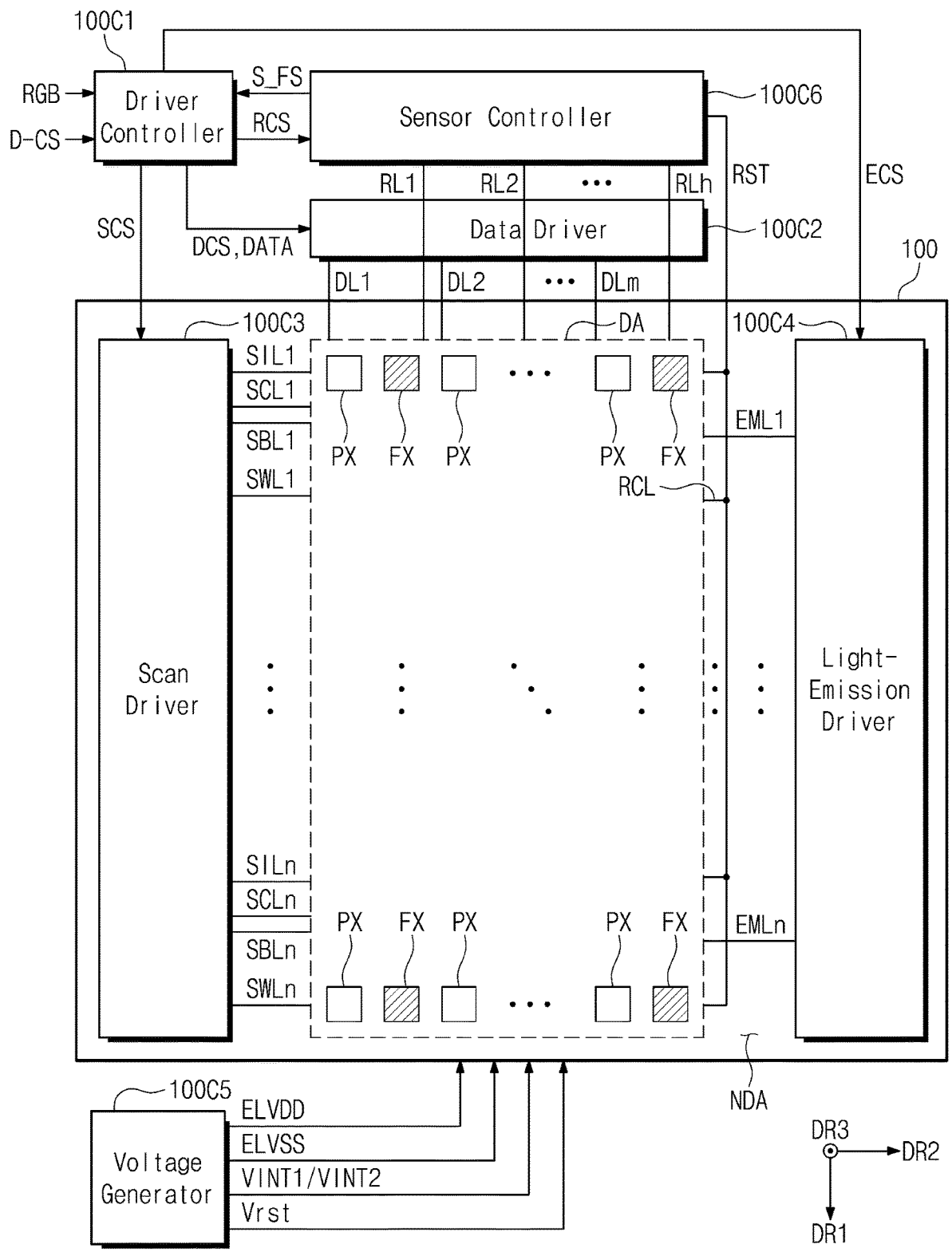
FIG. 3 is a schematic block diagram of a display layer and a display driver according to an embodiment.

FIG. 3 is a block diagram of the display panel 100 and the display driver 100C (refer to FIG. 2) according to an embodiment.

Referring to FIG. 2 and FIG. 3, the display driver 100C may include a drive controller 100C1, a data driver 100C2, a scan driver 100C3, a light-emission driver 100C4, a voltage generator 10005, and a sensor controller 10006.

The display panel 100 may include a display area DA corresponding to the active area 1000A (refer to FIG. 1) and a non-display area NDA corresponding to the peripheral area 1000NA (refer to FIG. 1).

The display panel 100 may include pixels PX disposed in the display area DA and sensors FX disposed in the display area DA. The display panel 100 may further include initialization scan lines SIL1 to SILn, compensation scan lines SCL1 to SCLn, write scan lines SWL1 to SWLn, black scan lines SBL1 to SBLn, light-emission control lines EML1 to EMLn, data lines DL1 to DLm, and read-out lines RL1 to RLh.

The initialization scan lines SIL1 to SILn, the compensation scan lines SCL1 to SCLn, the write scan lines SWL1 to SWLn, the black scan lines SBL1 to SBLn, and the light-emission control lines EML1 to EMLn may extend in the second direction DR2. The initialization scan lines SIL1 to SILn, the compensation scan lines SCL1 to SCLn, the write scan lines SWL1 to SWLn, the black scan lines SBL1 to SBLn, and the light-emission control lines EML1 to EMLn may be arranged so as to be spaced apart from each other in the first direction DR1. The data lines DL1 to DLm and the read-out lines RL1 to RLh may extend in the first direction DR1 and may be arranged so as to be spaced apart from each other in the second direction DR2.

The pixels PX may be respectively connected (e.g., electrically connected) to the initialization scan lines SIL1 to SILn, the compensation scan lines SCL1 to SCLn, the write scan lines SWL1 to SWLn, the black scan lines SBL1 to SBLn, the light-emission control lines EML1 to EMLn, and the data lines DL1 to DLm. For example, each of the pixels PX may be connected (e.g., electrically connected) to four scan lines. However, the number of scan lines connected to each pixel PX is not limited thereto and may be changed.

The sensors FX may be respectively connected (e.g., electrically connected) to the read-out lines RL1 to RLh. One sensor FX may be connected (e.g., electrically connected) to one scan line, for example, one write scan line among the write scan lines SWL1 to SWLn. However, embodiments are not limited thereto. The number of scan lines connected to each sensor FX may vary.

In an example, the number of read-out lines RL1 to RLh may be equal to ½ of the number of data lines DL1 to DLm. However, embodiments are not limited thereto. In another example, the number of read-out lines RL1 to RLh may be equal to ¼ or ⅛ of the number of data lines DL1 to DLm.

The drive controller 100C1 may receive the image data RGB and the control signal D-CS. The drive controller 100C1 may convert a data format of the image data RGB so as to comply with interface specifications with the data driver 100C2 to generate an image data signal DATA. The drive controller 100C1 may output a first control signal SCS, a second control signal ECS, a third control signal DCS, and a fourth control signal RCS.

The data driver 100C2 may receive the third control signal DCS and the image data signal DATA from the drive controller 100C1. The data driver 100C2 may convert the image data signal DATA into data signals, and may output the data signals to the data lines DL1 to DLm described below. The data signals may be analog voltages corresponding to grayscale values of the image data signal DATA.

The scan driver 100C3 may receive the first control signal SCS from the drive controller 100C1. The scan driver 100C3 may output scan signals to scan lines in response to the first control signal SCS. For example, in response to the first control signal SCS, the scan driver 100C3 may output initialization scan signals to the initialization scan lines SIL1 to SILn, and may output compensation scan signals to the compensation scan lines SCL1 to SCLn. Further, in response to the first control signal SCS, the scan driver 100C3 may output write scan signals to the write scan lines SWL1 to SWLn and may output black scan signals to the black scan lines SBL1 to SBLn.

The scan driver 100C3 may be disposed in the non-display area NDA of the display panel 100. However, embodiments are not limited thereto. For example, at least a portion of the scan driver 100C3 may be disposed in the display area DA.

The light-emission driver 100C4 may be disposed in the non-display area NDA of the display panel 100. The light-emission driver 100C4 may receive the second control signal ECS from the drive controller 100C1. The light-emission driver 100C4 may output light-emission control signals to the light-emission control lines EML1 to EMLn in response to the second control signal ECS. In another example, the scan driver 100C3 may be connected to the light-emission control lines EML1 to EMLn. For example, the light-emission driver 100C4 may be omitted, and the scan driver 100C3 may output the light-emission control signals to the light-emission control lines EML1 to EMLn.

The voltage generator 10005 may generate voltages necessary for the operation of the display panel 100. In an embodiment, the voltage generator 10005 may generate a first drive voltage ELVDD, a second drive voltage ELVSS, a first initialization voltage VINT1, a second initialization voltage VINT2, and a reset voltage Vrst.

The sensor controller 10006 may receive the fourth control signal RCS from the drive controller 100C1.

The sensor controller 10006 may receive sensed signals from the read-out lines RL1 to RLh in response to the fourth control signal RCS. The sensor controller 10006 may process the sensed signals received from the read-out lines RL1 to RLh and provide the processed sensed signals S_FS to the drive controller 100C1.

Figure 4:
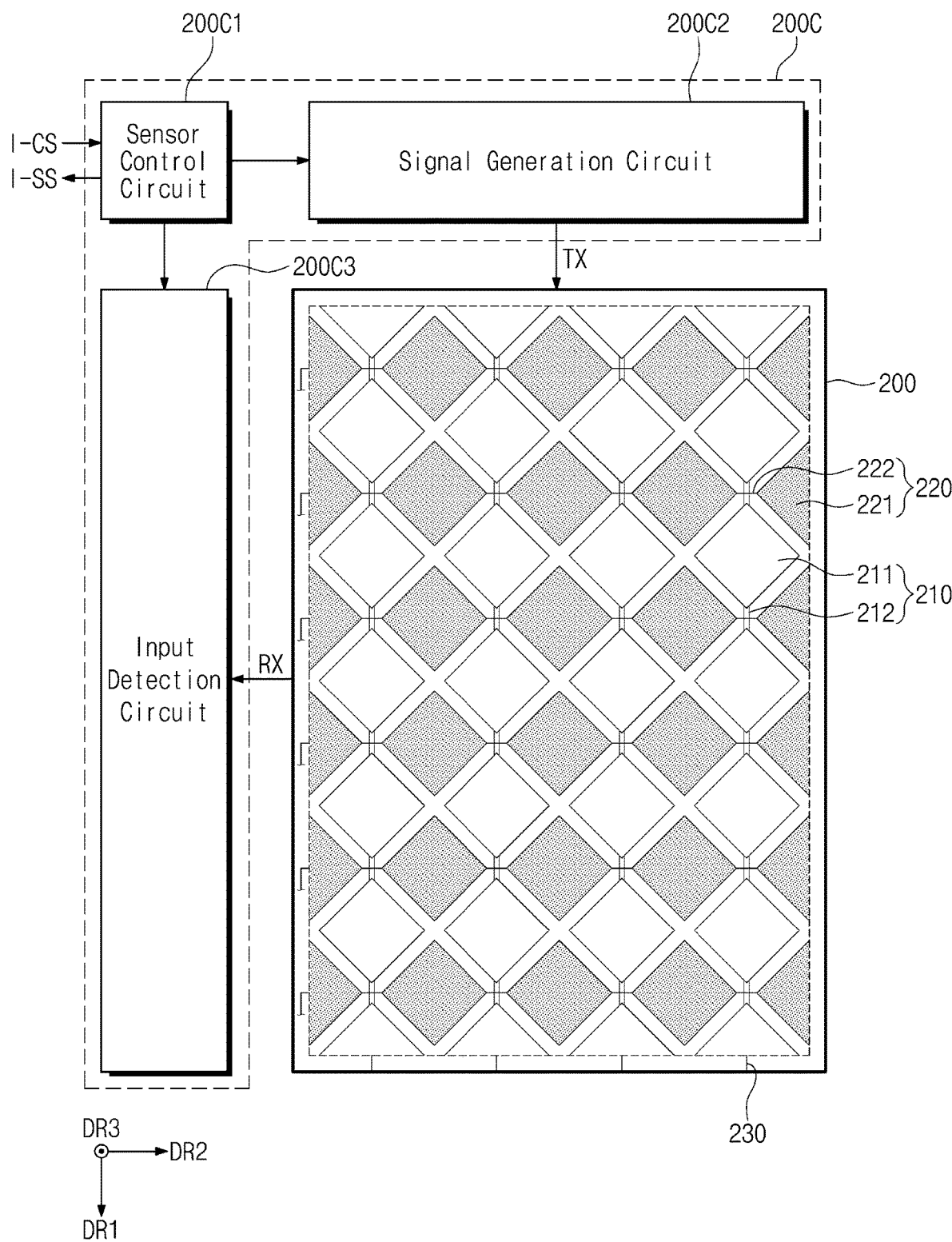
FIG. 4 is a schematic block diagram of a sensor layer and a sensor driver according to an embodiment.

FIG. 4 is a block diagram of the sensor layer 200 and the sensor driver 200C according to an embodiment.

Referring to FIG. 4, the sensor layer 200 may include first sensing electrodes 210 and second sensing electrodes 220. Each of the second sensing electrodes 220 may intersect the first sensing electrodes 210. For example, the sensor layer 200 may further include signal lines 230 respectively connected to the first sensing electrodes 210 and the second sensing electrodes 220. The signal lines 230 may overlap the non-display area NDA (refer to FIG. 3).

Each of the first sensing electrodes 210 may extend along the first direction DR1, and the first sensing electrodes 210 may be arranged so as to be spaced apart from each other in the second direction DR2. Each of the second sensing electrodes 220 may extend along the second direction DR2, and the second sensing electrodes 220 may be arranged so as to be spaced apart from each other in the first direction DR1.

Each of the first sensing electrodes 210 may include a sensing pattern layer 211 and a connection pattern layer 212. Two adjacent sensing pattern layers 211 may be connected (e.g., electrically connected) to each other via two connection pattern layers 212. However, embodiments are not limited thereto. The sensing pattern layer 211 and the connection pattern layers 212 may be disposed in/on different layers.

Each of the second sensing electrodes 220 may include a first portion 221 and a second portion 222. The first portion 221 and the second portion 222 may have an integral structure and may be disposed in/on the same layer. For example, the first portion 221 and the second portion 222 may be disposed in/on the same layer as a layer in/on which the sensing pattern layer 211 is disposed. The two connection pattern layers 212 may be insulated from the second portion 222 and may intersect the second portion 222.

The sensor driver 200C may receive the control signal I-CS from the main driver 1000C (refer to FIG. 2). The sensor driver 200C may provide the coordinate signal I-SS to the main driver 1000C (refer to FIG. 2).

The sensor driver 200C may be implemented as an integrated circuit (IC) and may be mounted (e.g., directly mounted) on a certain area of the sensor layer 200 or may be mounted on a separate printed circuit board in a chip on film (COF) scheme and may be connected (e.g., electrically connected) to the sensor layer 200.

The sensor driver 200C may include a sensor control circuit 200C1, a signal generation circuit 200C2, and an input detection circuit 200C3. The sensor control circuit 200C1 may control an operation of each of the signal generation circuit 200C2 and the input detection circuit 200C3 based on the control signal I-CS.

The signal generation circuit 200C2 may output transfer signals TX to the first sensing electrodes 210 of the sensor layer 200. The input detection circuit 200C3 may receive sensed signals RX from the sensor layer 200. For example, the input detection circuit 200C3 may receive the sensed signals RX from the second sensing electrodes 220. In an embodiment, the signal generation circuit 200C2 may output the transfer signals TX to the second sensing electrodes 220 of the sensor layer 200, and the input detection circuit 200C3 may receive the sensed signals RX from the first sensing electrodes 210.

The input detection circuit 200C3 may convert an analog signal into a digital signal. For example, the input detection circuit 200C3 may amplify the received analog signal and may filter the amplified analog signal. For example, the input detection circuit 200C3 may convert the filtered signal into the digital signal.

Figure 5:
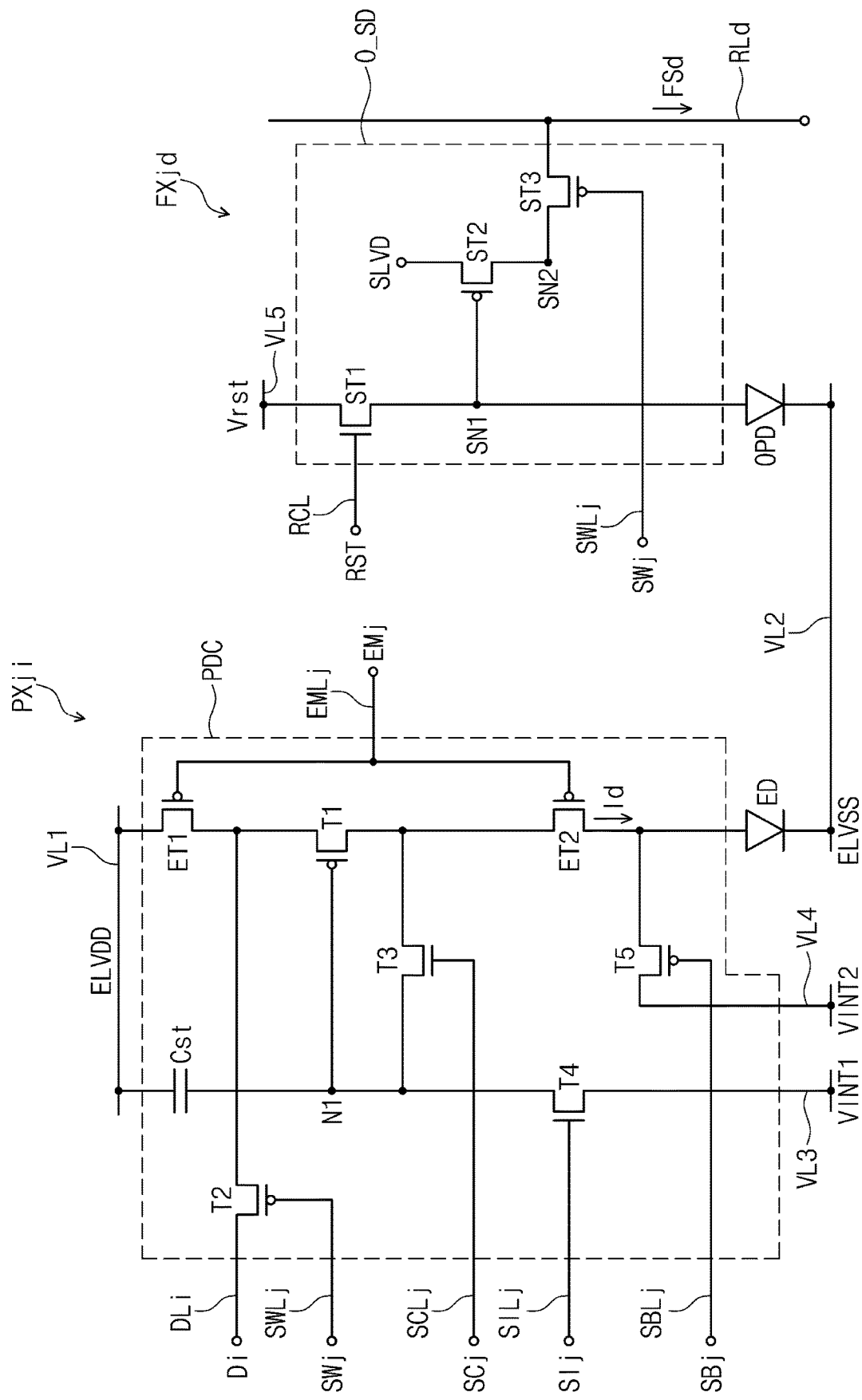
FIG. 5 is a schematic diagram of an equivalent circuit of a pixel and a sensor according to an embodiment.

FIG. 5 is a schematic diagram of an equivalent circuit of a pixel and a sensor according to an embodiment.

FIG. 5 shows a schematic diagram of an equivalent circuit of a pixel PXji among the pixels PX (refer to FIG. 3) as an example. Because the pixels PX has the same circuit structure, a detailed description of each of the remaining pixels PX is replaced with description of a circuit structure of the pixel PXji for descriptive convenience. Further, FIG. 5 shows a schematic diagram of an equivalent circuit of one sensor FXjd among the sensors FX shown in FIG. 3 as an example. Because the sensors FX has the same circuit structure, a detailed description of each of the remaining sensors FX is replaced with a description of a circuit structure of the sensor FXjd.

Referring to FIG. 3 and FIG. 5, the pixel PXji may be connected to an i-th data line DLi among the data lines DL1 to DLm, a j-th initialization scan line SILj among the initialization scan lines SIL1 to SILn, a j-th compensation scan line SCLj among the compensation scan lines SCL1 to SCLn, a j-th write scan line SWLj among the write scan lines SWL1 to SWLn, a j-th black scan line SBLj among the black scan lines SBL1 to SBLn, and a j-th light-emission control line EMLj among the light-emission control lines EML1 to EMLn.

The pixel PXji may include a light-emitting element ED and a pixel drive circuit PDC. The light-emitting element ED may be a light-emitting diode. In an example, the light-emitting element ED may be an organic light-emitting diode including an organic light-emitting layer. However, embodiments are not limited thereto.

The pixel drive circuit PDC may include first to fifth transistors T1, T2, T3, T4, and T5, first and second light-emission control transistors ET1 and ET2, and one capacitor Cst.

At least one of the first to fifth transistors T1, T2, T3, T4, and T5, and the first and second light-emission control transistors ET1 and ET2 may be a transistor having a low-temperature polycrystalline silicon (LTPS) semiconductor layer. At least one of the first to fifth transistors T1, T2, T3, T4, and T5, and the first and second light-emission control transistors ET1 and ET2 may be a transistor having an oxide semiconductor layer. For example, the third and fourth transistors T3 and T4 may be the oxide semiconductor transistors, in case that the first, second and fifth transistors T1, T2 and T5, and the first and second light-emission control transistors ET1 and ET2 are the LTPS transistors.

For example, the first transistor T1 which directly affects brightness of the display device 1000 (refer to FIG. 1) may include a semiconductor layer composed of highly reliable polycrystalline silicon, and thus, a high-resolution display device may be implemented. In an example, an oxide semiconductor may have high carrier mobility and low leakage current. Thus, although an operation time is large, a voltage drop may not be large. For example, because a color change of an image due to a voltage drop is not large even during a low-frequency operation, a low-frequency operation may be performed. Further, the oxide semiconductor may have small leakage current. Thus, at least one of the third transistor T3 and the fourth transistor T4 connected to a third electrode (or a gate electrode) of the first transistor T1 may include the oxide semiconductor to prevent leakage current that may otherwise flow to the gate electrode and to reduce consuming power.

Each of some of the first to fifth transistors T1, T2, T3, T4, and T5 and the first and second light-emission control transistors ET1 and ET2 may be a P-type transistor, and each of the remaining ones may be an N-type transistor. For example, each of the first, second, and fifth transistors T1, T2, and T5, and the first and second light-emission control transistors ET1 and ET2 may be a P-type transistor, and each of the third and fourth transistors T3 and T4 may be an N-type transistor.

A configuration of the pixel drive circuit PDC according to embodiments are not limited to an embodiment as shown in FIG. 5. The pixel drive circuit PDC as shown in FIG. 5 is just an example, and the configuration of the pixel drive circuit PDC may be implemented in a modified manner. For example, all of the first to fifth transistors T1, T2, T3, T4, and T5, and the first and second light-emission control transistors ET1 and ET2 may be P-type transistors or N-type transistors.

The j-th initialization scan line SILj, the j-th compensation scan line SCLj, the j-th write scan line SWLj, the j-th black scan line SBLj and the j-th light-emission control line EMLj may respectively transfer a j-th initialization scan signal SIj, a j-th compensation scan signal SCj, a j-th write scan signal SWj, a j-th black scan signal SBj, and a j-th light-emission control signal EMj to the pixel PXji. The i-th data line DLi may transfer an i-th data signal Di to the pixel PXji. The i-th data signal Di may have a voltage level corresponding to the image data RGB (refer to FIG. 2) input to the display device 1000 (refer to FIG. 2).

First and second drive voltage lines VL1 and VL2 may transfer the first drive voltage ELVDD and the second drive voltage ELVSS to the pixel PXji, respectively. Further, first and second initialization voltage lines VL3 and VL4 may transfer the first initialization voltage VINT1 and the second initialization voltage VINT2 to the pixel PXji, respectively.

The first transistor T1 may be connected to and disposed between the first drive voltage line VL1 receiving the first drive voltage ELVDD and the light-emitting element ED. The first transistor T1 may include a first electrode connected to the first drive voltage line VL1 via the first light-emission control transistor ET1, a second electrode connected to the light-emitting element ED via the second light-emission control transistor ET2, and a third electrode (e.g., a gate electrode) connected to an end portion (e.g., a first node N1) of the capacitor Cst. The first transistor T1 may receive the i-th data signal Di transmitted from the i-th data line DLi under a switching operation of the second transistor T2 and may supply a drive current Id to the light-emitting element ED.

The second transistor T2 may be connected to and disposed between the data line DLi and the first electrode of the first transistor T1. The second transistor T2 may include a first electrode connected to the data line DLi, a second electrode connected to the first electrode of the first transistor T1, and a third electrode (e.g., a gate electrode) connected to the j-th write scan line SWLj. The second transistor T2 may be turned on based on the write scan signal SWj received from the j-th write scan line SWLj to transmit the i-th data signal Di applied from the i-th data line DLi to the first electrode of the first transistor T1.

The third transistor T3 may be connected to and disposed between the second electrode of the first transistor T1 and the first node N1. The third transistor T3 may include a first electrode connected to the third electrode of the first transistor T1, a second electrode connected to the second electrode of the first transistor T1, and a third electrode (e.g., a gate electrode) connected to the j-th compensation scan line SCLj. The third transistor T3 may be turned on based on the j-th compensation scan signal SCj received from the j-th compensation scan line SCLj to connect the third electrode and the second electrode of the first transistor T1 to each other such that the first transistor T1 may be conductive in a diode manner.

The fourth transistor T4 may be connected to and disposed between the first node N1 and the first initialization voltage line VL3 to which the first initialization voltage VINT1 is applied. The fourth transistor T4 may include a first electrode connected to the first initialization voltage line VL3 to which the first initialization voltage VINT1 is applied, a second electrode connected to the first node N1, and a third electrode (e.g., a gate electrode) connected to the j-th initialization scan line SILj. The fourth transistor T4 may be turned on based on the j-th initialization scan signal SIj received from the j-th initialization scan line SILj. The turned-on fourth transistor T4 may transfer the first initialization voltage VINT1 to the first node N1 to initialize a potential of the third electrode of the first transistor T1, e.g., a potential of the first node N1.

The first light-emission control transistor ET1 may include a first electrode connected to the first drive voltage line VL1, a second electrode connected to the first electrode of the first transistor T1, and a third electrode (e.g., a gate electrode) connected to the j-th light-emission control line EMLj.

The second light-emission control transistor ET2 may include a first electrode connected to the second electrode of the first transistor T1, a second electrode connected to light-emitting element ED, and a third electrode (e.g., a gate electrode) connected to the j-th light-emission control line EMLj.

The first and second light-emission control transistors ET1 and ET2 may be simultaneously turned on based on the j-th light-emission control signal EMj transmitted from the j-th light-emission control line EMLj. The first drive voltage ELVDD applied through the turned-on first light-emission control transistor ET1 may be compensated by diode-connecting the first transistor T1, and then may be transmitted to the light-emitting element ED.

The fifth transistor T5 may include a first electrode connected to the second initialization voltage line VL4 to which the second initialization voltage VINT2 is transmitted, a second electrode connected to the second electrode of the second light-emission control transistor ET2, and a third electrode (e.g., a gate electrode) connected to the black scan line SBLj. The second initialization voltage VINT2 may have a voltage level lower than or equal to that of the first initialization voltage VINT1.

As described above, an end portion of capacitor Cst may be connected to the third electrode of the first transistor T1, and another end portion thereof may be connected to the first drive voltage line VL1. A cathode of the light-emitting element ED may be connected to the second drive voltage line VL2 transferring the second drive voltage ELVSS. The second drive voltage ELVSS may have a lower voltage level than that of the first drive voltage ELVDD.

The sensor FX may be connected to a d-th read-out line RLd among the read-out lines RL1 to RLh, the j-th write scan line SWLj (referred to as an output control line), and a reset control line RCL.

The sensor FX may include a light-sensing element OPD (or referred to as a sensing element), and a sensor drive circuit O_SD.

The light-sensing element OPD may be a photodiode. In an example, the light-sensing element OPD may be an organic photodiode including an organic material as a material of a photoelectric conversion layer. A first electrode AE-S (refer to FIG. 6) of the light-sensing element OPD may be connected to a first sensing node SN1. A second electrode CE (refer to FIG. 6) of the light-sensing element OPD may be connected to the second drive voltage line VL2 transferring the second drive voltage ELVSS. FIG. 5 shows an example in which the sensor FX includes one light-sensing element OPD. However, embodiments are not limited thereto. For example, the sensor FX may include z light-sensing elements connected in parallel to each other, where z is an integer of 2 or greater.

The sensor drive circuit O_SD may include three transistors ST1, ST2, and ST3. The three transistors ST1, ST2, and ST3 may include a reset transistor ST1, an amplification transistor ST2, and an output transistor ST3. At least one of the reset transistor ST1, the amplification transistor ST2, or the output transistor ST3 may be an oxide semiconductor transistor. In an example, the reset transistor ST1 may be an oxide semiconductor transistor, in case that each of the amplification transistor ST2 and the output transistor ST3 are a LTPS transistor. However, embodiments are not limited thereto. Each of at least the reset transistor ST1 and the output transistor ST3 may be an oxide semiconductor transistor, in case that the amplification transistor ST2 is an LTPS transistor.

Further, each of some of the reset transistor ST1, the amplification transistor ST2, and the output transistor ST3 may be a P-type transistor, in case that each of the others thereof is an N-type transistor. In an example, each of the amplification transistor ST2 and the output transistor ST3 may be a P-type transistor, and the reset transistor ST1 may be a N-type transistor. However, embodiments are not limited thereto, and all of the reset transistor ST1, the amplification transistor ST2, and the output transistor ST3 may be N-type transistors or P-type transistors.

A circuit configuration of the sensor drive circuit O_SD is not limited to FIG. 5. The sensor drive circuit O_SD as shown in FIG. 5 is just an example, and the configuration of the sensor drive circuit O_SD may be implemented in a modified manner.

The reset transistor ST1 may include a first electrode connected to a third initialization voltage line VL5 to receive the reset voltage Vrst, a second electrode connected to the first sensing node SN1, and a third electrode to receive a reset control signal RST. The reset transistor ST1 may reset a potential of the first sensing node SN1 to the reset voltage Vrst in response to the reset control signal RST. The reset control signal RST may be a signal provided via the reset control line RCL.

The amplification transistor ST2 may include a first electrode receiving a sensing drive voltage SLVD, a second electrode connected to a second sensing node SN2, and a third electrode connected to the first sensing node SN1. The amplification transistor ST2 may be turned on based on the potential of the first sensing node SN1, to apply the sensing drive voltage SLVD to the second sensing node SN2. In an example, the sensing drive voltage SLVD may be one of the first drive voltage ELVDD, the first and second initialization voltages VINT1 and VINT2. In case that the sensing drive voltage SLVD is the first drive voltage ELVDD, the first electrode of the amplification transistor ST2 may be connected (e.g., electrically connected) to the first drive voltage line VL1. In case that the sensing drive voltage SLVD is the first initialization voltage VINT1, the first electrode of the amplification transistor ST2 may be connected (e.g., electrically connected) to the first initialization voltage line VL3. In case that the sensing drive voltage SLVD is the second initialization voltage VINT2, the first electrode of the amplification transistor ST2 may be connected (e.g., electrically connected) to the second initialization voltage line VL4.

The output transistor ST3 may include a first electrode connected to the second sensing node SN2, a second electrode connected to the d-th read-out line RLd, and a third electrode receiving an output control signal. The output transistor ST3 may transmit a sensed signal FSd to the d-th read-out line RLd in response to the output control signal. The output control signal may be the j-th write scan signal SWj (or referred to as a j-th output control signal) supplied from the j-th write scan line SWLj. For example, the output transistor ST3 may receive the j-th write scan signal SWj supplied from the j-th write scan line SWLj as the output control signal.

A reset period may be defined as an activation period (e.g., a high level period) of the reset control line RCL. In case that the reset control signal RST of the high level is supplied from the reset control line RCL to the reset transistor ST1, the reset transistor ST1 may be turned on. In another example, in case that the reset transistor ST1 is formed as a PMOS transistor, the reset control signal RST of a low level may be supplied to the reset control line RCL for the reset period. For the reset period, the first sensing node SN1 may be reset to a potential corresponding to the reset voltage Vrst. In an example, the reset voltage Vrst may have a voltage level lower than that of the second drive voltage ELVSS.

The light-sensing element OPD of the sensor FXjd may be exposed to light for a light-emitting period of the light-emitting element ED. A voltage of the first sensing node SN1 may be maintained at the reset voltage Vrst for the reset period. Then, as the light-sensing element OPD is exposed to light, the voltage of the first sensing node SN1 may gradually shift to the second drive voltage ELVSS. The amplification transistor ST2 may be a source follower amplifier that generates a source-drain current in proportion to a charge amount of the first sensing node SN1 input to the third electrode thereof.

For an output period, the j-th write scan signal SWj of a low level is supplied to the output transistor ST3 via the j-th write scan line SWLj. In case that the output transistor ST3 is turned on in response to the j-th write scan signal SWj of the low level, the sensed signal FSd corresponding to a current flowing through the amplification transistor ST2 may be output to the d-th read-out line RLd.

Figure 6:
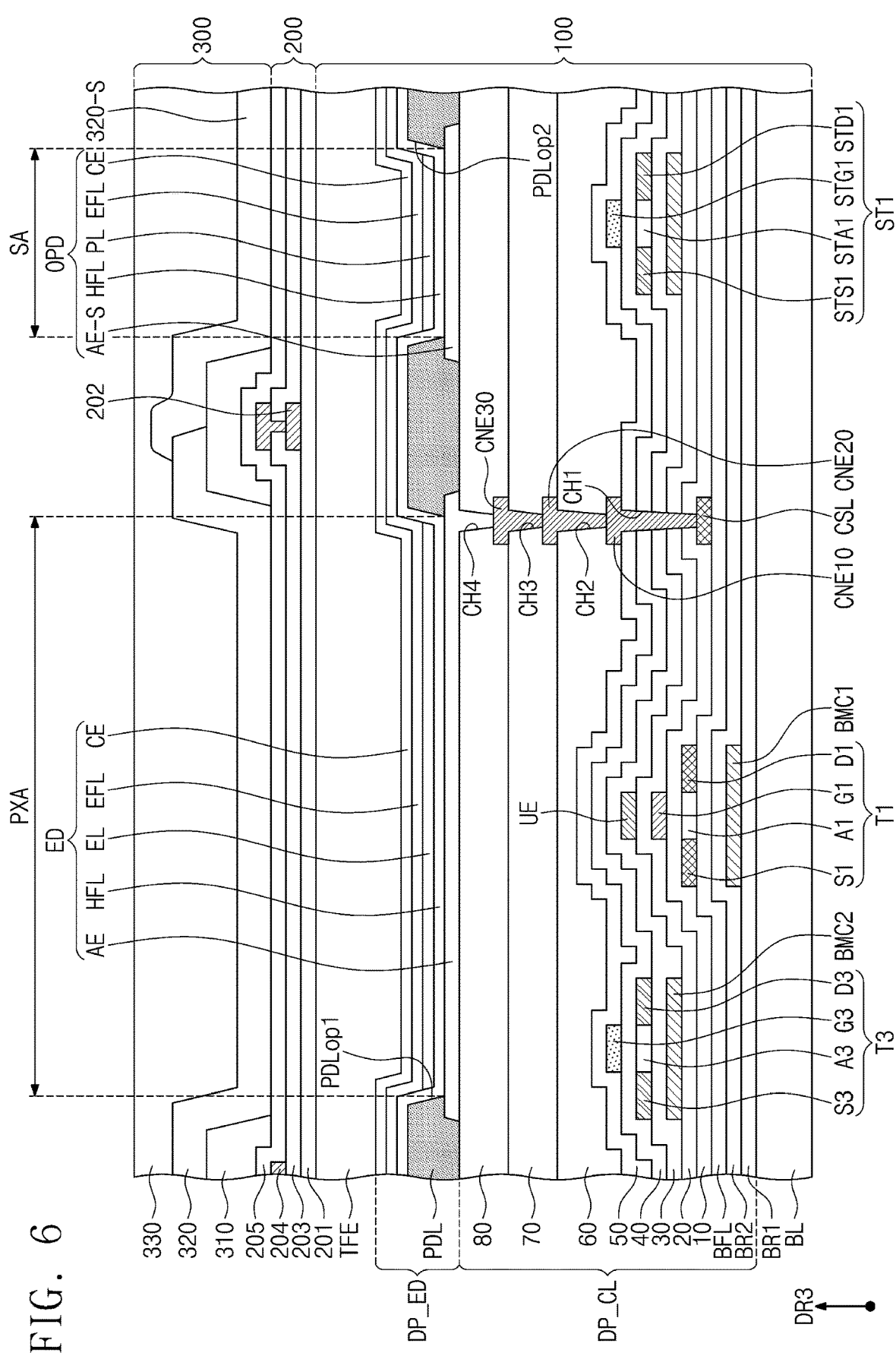
FIG. 6 is a schematic cross-sectional view of a display device according to an embodiment.

FIG. 6 is a schematic cross-sectional view of a display device according to an embodiment.

Referring to FIG. 6, the display panel 100 may include a base layer BL, a circuit layer DP_CL, an element layer DP_ED, and an encapsulation layer TFE disposed on the base layer BL.

At least one inorganic layer may be formed on a top surface (or upper surface) of the base layer BL. The inorganic layer may include at least one of aluminum oxide, titanium oxide, silicon oxide, silicon oxynitride, zirconium oxide, or hafnium oxide. The inorganic layer may have a stack structure of multiple layers. The stack structure of the inorganic layers may form barrier layers BR1 and BR2 and/or a buffer layer BFL to be described below. The barrier layers BR1 and BR2 and the buffer layer BFL may optionally be disposed.

The barrier layers BR1 and BR2 may prevent inflow of foreign material from an outside. Each of the barrier layers BR1 and BR2 may include a silicon oxide layer or a silicon nitride layer. Each of the barrier layers BR1 and BR2 may include a stack of layers in which silicon oxide layers and silicon nitride layers may be alternately stacked on top (or upper surface) of each other. In an embodiment, each of the barrier layers BR1 and BR2 may be a silicon oxide layer.

The barrier layers BR1 and BR2 may include the first barrier layer BR1 and the second barrier layer BR2. A first rear metal layer BMC1 may be disposed between the first barrier layer BR1 and the second barrier layer BR2. The first rear metal layer BMC1 may include molybdenum (Mo). However, embodiments are not limited thereto. In another example, the first rear metal layer BMC1 may be omitted.

The buffer layer BFL may be disposed on the barrier layers BR1 and BR2. The buffer layer BFL may improve coupling between the base layer BL and a semiconductor pattern layer and/or a conductive pattern layer. The buffer layer BFL may include a silicon oxide layer and a silicon nitride layer. The silicon oxide layers and the silicon nitride layers may be alternately stacked on top of each other.

A first semiconductor pattern layer may be disposed on the buffer layer BFL. The first semiconductor pattern layer may include silicon semiconductor. For example, the silicon semiconductor may include amorphous silicon, polycrystalline silicon, and the like. For example, the first semiconductor pattern layer may include low-temperature polysilicon.

FIG. 6 only shows a portion of the first semiconductor pattern layer disposed on the buffer layer BFL. Another portion of the first semiconductor pattern layer may be further disposed in another area. The first semiconductor pattern layers may be arranged across the pixels according to a specific rule. The first semiconductor pattern layer may have different electrical properties according to whether the first semiconductor pattern layer is doped or not. The first semiconductor pattern layer may include a first area with high conductivity and a second area with low conductivity. The first area may be doped with an N-type dopant or a P-type dopant. A P-type transistor may include a doped area doped with a P-type dopant, and an N-type transistor may include a doped area doped with an N-type dopant. The second area may be a non-doped area or an area doped with a dopant at a lower concentration than a concentration at which the first area is doped.

The conductivity of the first area may be greater than that of the second area, and the first area may function as an electrode or a signal line. The second area may substantially correspond to an active area (or a channel) of a transistor. For example, a portion of a semiconductor pattern layer may be an active area of a transistor, another portion thereof may be a source or a drain of the transistor, and still another portion thereof may be a connection electrode or a connection signal line.

A first electrode S1, an active area A1, and a second electrode D1 of the first transistor T1 may be formed from the first semiconductor pattern layer. The first electrode S1 and the second electrode D1 of the first transistor T1 may extend from the active area A1 in opposite directions to each other. One of the first electrode S1 and the second electrode D1 may be referred to as a drain area, and the other thereof may be referred to as a source area.

FIG. 6 shows a portion of a connection signal line CSL formed from the first semiconductor pattern layer. For example, the connection signal line CSL may be connected to the second electrode of the fifth transistor T5 (refer to FIG. 5) in a plan view.

A first insulating layer 10 may be disposed on the buffer layer BFL. The first insulating layer 10 may overlap all of the pixels and may cover the first semiconductor pattern layer. The first insulating layer 10 may be an inorganic layer and/or an organic layer, and may have a single-layer structure or a multi-layer structure. The first insulating layer 10 may include at least one of aluminum oxide, titanium oxide, silicon oxide, silicon nitride, silicon oxynitride, zirconium oxide, or hafnium oxide. In an embodiment, the first insulating layer 10 may be a single layer made of silicon oxide. In addition to the first insulating layer 10, an insulating layer of the circuit layer DP_CL as described below may be an inorganic layer and/or an organic layer, and may have a single-layer structure or a multi-layer structure. The inorganic layer may include at least one of the above materials. However, embodiments are not limited thereto.

A third electrode G1 of the first transistor T1 may be disposed on the first insulating layer 10. The third electrode G1 may be a portion of a metal pattern layer. The third electrode G1 of the first transistor T1 may overlap the active area A1 of the first transistor T1. In a process of doping the first semiconductor pattern layer, the third electrode G1 of the first transistor T1 may function as a mask. The third electrode G1 may include titanium (Ti), silver (Ag), an alloy containing silver, molybdenum (Mo), an alloy containing molybdenum, aluminum (Al), alloy containing aluminum, aluminum nitride (AlN), tungsten (W), tungsten nitride (WN), copper (Cu), indium tin oxide (ITO), indium zinc oxide (IZO), etc. However, embodiments are not limited thereto.

A second insulating layer 20 may be disposed on the first insulating layer 10 and may cover the third electrode G1 of the first transistor T1. The second insulating layer 20 may be an inorganic layer and/or an organic layer, and may have a single-layer structure or a multi-layer structure. The second insulating layer 20 may include at least one of silicon oxide, silicon nitride, or silicon oxynitride. In an embodiment, the second insulating layer 20 may have a single layer structure including a silicon nitride layer.

An upper electrode UE and a second rear metal layer BMC2 may be disposed on the second insulating layer 20. The upper electrode UE may overlap the third electrode G1. The upper electrode UE may be a portion of a metal pattern layer. A portion of the third electrode G1 and the upper electrode UE overlapping the same may define the capacitor Cst (refer to FIG. 5). In an embodiment, the second insulating layer 20 may be replaced with an insulating pattern layer. For example, the upper electrode UE may be disposed on the insulating pattern layer, and the upper electrode UE may function as a mask used for forming the insulating pattern layer from the second insulating layer 20.

The second rear metal layer BMC2 may be disposed below an oxide thin-film transistor, for example, the third transistor T3 so as to overlap each other. The second rear metal layer BMC2 may receive a constant voltage or signal.

A third insulating layer 30 may be disposed on the second insulating layer 20 and may cover the upper electrode UE and the second rear metal layer BMC2. The third insulating layer 30 may have a single-layer structure or a multi-layer structure. For example, the third insulating layer 30 may have a multi-layer structure including a silicon oxide layer and a silicon nitride layer.

A second semiconductor pattern layer may be disposed on the third insulating layer 30. The second semiconductor pattern layer may include oxide semiconductor. For example, the second semiconductor pattern layer may include indium-gallium-zinc oxide (IGZO). However, embodiments are not limited thereto.

An oxide semiconductor may include areas distinguished from each other based on whether or not a metal oxide is reduced. An area (hereinafter, referred to as a reduced area) where the metal oxide is reduced may have higher conductivity than that of an area (hereinafter, referred to as a non-reduced area) where the metal oxide is not reduced. The reduced area may function as a source or a drain of a transistor or a signal line. The non-reduced area may substantially correspond to an active area (or a semiconductor area or a channel) of the transistor. For example, a portion of the second semiconductor pattern layer may be an active area of a transistor, another portion thereof may be a source/drain area of a transistor, and still another portion thereof may be a signal transfer area.

A first electrode S3, an active area A3, and a second electrode D3 of the third transistor T3 may be formed from the second semiconductor pattern layer. Each of the first electrode S3 and the second electrode D3 may include a metal reduced from a metal oxide semiconductor. The first electrode S3 and the second electrode D3 may extend from the active area A3 in opposite directions to each other in a cross-sectional view.

A fourth insulating layer 40 may be disposed on the third insulating layer 30. The fourth insulating layer 40 may overlap all of the pixels and may cover the second semiconductor pattern layer. The fourth insulating layer 40 may include at least one of aluminum oxide, titanium oxide, silicon oxide, silicon nitride, silicon oxynitride, zirconium oxide, or hafnium oxide.

A third electrode G3 of the third transistor T3 may be disposed on the fourth insulating layer 40. The third electrode G3 may be a portion of a metal pattern layer. The third electrode G3 of the third transistor T3 may overlap the active area A3 of the third transistor T3. In a process of reducing the second semiconductor pattern layer, the third electrode G3 may function as a mask. In an embodiment, the fourth insulating layer 40 may be replaced with an insulating pattern layer. The third electrode G3 may have a multi-layer structure in which a molybdenum layer and a titanium layer are stacked.

A fifth insulating layer 50 may be disposed on the fourth insulating layer 40 and may cover the third electrode G3. The fifth insulating layer 50 may be an inorganic layer. The fifth insulating layer 50 may have a multi-layer structure including a silicon oxide layer and a silicon nitride layer.

A first connection electrode CNE10 may be disposed on the fifth insulating layer 50. The first connection electrode CNE10 may be connected to the connection signal line CSL via a first contact hole CH1 extending through the first to fifth insulating layers 10, 20, 30, 40, and 50. The first connection electrode CNE10 may have a multi-layer structure in which a titanium layer, an aluminum layer, and a titanium layer are stacked.

A sixth insulating layer 60 may be disposed on the fifth insulating layer 50. The sixth insulating layer 60 may be an organic layer. The organic layer may include a general-purpose polymer such as BCB (Benzocyclobutene), polyimide, HMDSO (Hexamethyldisiloxane), Polymethylmethacrylate (PMMA), or polystyrene (PS), a polymer derivative having a phenolic group, an acrylate-based polymer, an imide-based polymer, an arylether-bsaed polymer, an amide-based polymer, a fluorine-based polymer, a p-xylene-based polymer, a vinyl alcohol-based polymer, or blends thereof. However, embodiments are not limited thereto.

A second connection electrode CNE20 may be disposed on the sixth insulating layer 60. The second connection electrode CNE20 may be connected to the first connection electrode CNE10 via a second contact hole CH2 extending through the sixth insulating layer 60. The second connection electrode CNE20 may have a multi-layer structure in which a titanium layer, an aluminum layer, and a titanium layer are stacked. A seventh insulating layer 70 may be disposed on the sixth insulating layer 60 and may cover the second connection electrode CNE20. The seventh insulating layer 70 may be an organic layer.

A third connection electrode CNE30 may be disposed on the seventh insulating layer 70. The third connection electrode CNE30 may be connected to the second connection electrode CNE20 via a third contact hole CH3 extending through the seventh insulating layer 70. The third connection electrode CNE30 may have a multi-layer structure in which a titanium layer, an aluminum layer, and a titanium layer are stacked. However, embodiments are not limited thereto. For example, the third connection electrode CNE30 may include a transparent conductive material. The third connection electrode CNE30 may include transparent conducting oxide (TCO).

An eighth insulating layer 80 may be disposed on the seventh insulating layer 70 and may cover the third connection electrode CNE30. The eighth insulating layer 80 may be an organic layer.

The circuit layer DP_CL may further include the sensor drive circuit O_SD (refer to FIG. 5). For the convenience of illustration, the reset transistor ST1 of the sensor drive circuit O_SD is shown. A first electrode STS1, an active area STA1, and a second electrode STD1 of the reset transistor ST1 may be formed from the second semiconductor pattern layer. Each of the first electrode STS1 and the second electrode STD1 may include a metal reduced from a metal oxide semiconductor. The fourth insulating layer 40 may be disposed to cover the first electrode STS1, the active area STA1, and the second electrode STD1 of the reset transistor ST1. A third electrode STG1 of the reset transistor ST1 may be disposed on the fourth insulating layer 40. In an embodiment, the third electrode STG1 may be a portion of a metal pattern layer. The third electrode STG1 of the reset transistor ST1 may overlap the active area STA1 of the reset transistor ST1.

In an example, the reset transistor ST1 and the third transistor T3 may be disposed in/on the same layer. For example, the first electrode STS1, the active area STA1, and the second electrode STD1 of the reset transistor ST1 and the first electrode S3, the active area A3, and the second electrode D3 of the third transistor T3 may be formed by the same process. The third electrode STG1 of the reset transistor ST1 and the third electrode G3 of the third transistor T3 may be formed simultaneously by the same process. For example, the first electrode and the second electrode of each of the amplification transistor ST2 and the output transistor ST3 of the sensor drive circuit O_SD, and the first electrode S1 and the second electrode D1 of the first transistor T1 may be formed by the same process. Because the reset transistor ST1 and the third transistor T3 are formed in/on the same layer and by the same process, an additional process for forming the reset transistor ST1 may not be required such that process efficiency may be improved, and a manufacturing cost may be reduced.

The element layer DP_ED may be disposed on the circuit layer DP_CL. The element layer DP_ED may include the light-emitting elements ED and the light-sensing elements OPD. FIG. 6 representatively shows a light-emitting element ED and a light-sensing element OPD.

The light-emitting element ED may include a first electrode AE, a first function layer HFL, a light-emitting layer EL, a second function layer EFL, and the second electrode CE. The light-sensing element OPD may include the first electrode AE-S, the first function layer HFL, a photoelectric conversion layer PL, the second function layer EFL, and the second electrode CE. The first function layer HFL, the second function layer EFL, and the second electrode CE may commonly belong to the pixels PX (refer to FIG. 3) and the sensors FX (refer to FIG. 3).

The first electrode AE of the light-emitting element ED and the first electrode AE-S of the light-sensing element OPD may be disposed on the eighth insulating layer 80. The first electrode AE of the light-emitting element ED may be connected to the third connection electrode CNE30 via a fourth contact hole CH4 extending through the eighth insulating layer 80.

A pixel defining film PDL may be disposed on the eighth insulating layer 80 and may cover a portion of each of the first electrodes AE and AE-S. Openings PDLop1 and PDLop2 may be defined in the pixel defining film PDL. Light-emitting areas and sensing areas may be defined by the openings PDLop1 and PDLop2. FIG. 6 shows a light-emitting area PXA among the light-emitting areas and a sensing area SA among the sensing areas. For example, the light-emitting area PXA may be defined by the first opening PDLop1, and the sensing area SA may be defined by the second opening PDLop2. The first opening PDLop1 may expose at least a portion of the first electrode AE of the light-emitting element ED. The second opening PDLop2 may expose at least a portion of the first electrode AE-S of the light-sensing element OPD.

In an embodiment, the pixel defining film PDL may further include a black material. The pixel defining film PDL may further include black organic dyes/pigments such as carbon black or aniline black. The pixel defining film PDL may be formed by mixing a blue organic material and a black organic material with each other. The pixel defining film PDL may further include a liquid-repellent organic material.

The light-emitting layer EL of the light-emitting element ED may be disposed in an area corresponding to the first opening PDLop1. The light-emitting layer EL may generate certain colored light. Although a patterned light-emitting layer EL is described in this embodiment, a single light-emitting layer may be commonly disposed across the light-emitting areas. For example, the light-emitting layer may generate white light or blue light. Further, the light-emitting layer may have a multilayer structure referred to as a tandem.

The light-emitting layer EL may include a low molecular weight organic material or a high molecular weight organic material as a light-emitting material. In another example, the light-emitting layer EL may include a quantum dot material as a light-emitting material. A core of the quantum dot may be selected from a group II-VI compound, a group III-V compound, a group IV-VI compound, a group IV element, a group IV compound, and combinations thereof.

The photoelectric conversion layer PL may be disposed in an area corresponding to the second opening PDLop2. The photoelectric conversion layer PL may include an organic photo sensing material. The second electrode CE may be disposed on the photoelectric conversion layer PL. Each of the first electrode AE-S and the second electrode CE may receive an electrical signal. The first electrode AE-S and the second electrode CE may receive different signals. Therefore, a certain electric field may be generated between the first electrode AE-S and the second electrode CE. The photoelectric conversion layer PL may generate an electrical signal corresponding to the light incident on the sensor.

The charge generated in the photoelectric conversion layer PL may change the electric field between the first electrode AE-S and the second electrode CE. An amount of charges generated in the photoelectric conversion layer PL may vary according to whether light is incident on the light-sensing element OPD, an amount of light incident on the light-sensing element OPD, and an intensity thereof. Accordingly, the electric field generated between the first electrode AE-S and the second electrode CE may vary. The light-sensing element OPD may acquire user's fingerprint information based on a change in the electric field between the first electrode AE-S and the second electrode CE.

The element layer DP_ED may further include a capping layer disposed on the second electrode CE. The capping layer may function to improve light-emitting efficiency under the principle of constructive interference. The capping layer may include, for example, a material having a refractive index of about 1.6 or higher relative to light having a wavelength of about 589 nm. The capping layer may be an organic capping layer including an organic material, an inorganic capping layer including an inorganic material, or a composite capping layer including an organic material and an inorganic material. For example, the capping layer may include a carbocyclic compound, a heterocyclic compound, an amine group-containing compound, porphine derivatives, phthalocyanine derivatives, naphthalocyanine derivatives, an alkali metal complex, an alkaline earth metal complex, or any combinations thereof. Each of the carbocyclic compound, the heterocyclic compound, and the amine group-containing compound may be optionally substituted with a substituent including oxygen (O), nitrogen (N), sulfur (S), selenium (Se), silicon (Si), fluorine (F), chlorine (Cl), bromine (Br), iodine (I), or any combination thereof.

The encapsulation layer TFE may be disposed on the element layer DP_ED. The encapsulation layer TFE may include at least an inorganic or organic layer. In an embodiment, the encapsulation layer TFE may include two inorganic layers and an organic layer disposed therebetween. In an embodiment, a thin-film encapsulation layer may include inorganic layers and organic layers that are alternately stacked on top of each other.

The encapsulation inorganic layer may protect the light-emitting element ED and the light-sensing element OPD from moisture/oxygen. The encapsulation organic layer may protect the light-emitting element ED and the light-sensing element OPD from foreign materials such as dust particles. The encapsulation inorganic layer may include a silicon nitride layer, a silicon oxy nitride layer, a silicon oxide layer, a titanium oxide layer, or an aluminum oxide layer, etc. The encapsulation organic layer may include an acrylate-based organic layer. However, embodiments are not limited thereto.

The display device 1000 (refer to FIG. 1) may further include the sensor layer 200 and an anti-reflective layer 300.

The sensor layer 200 may be disposed on the display panel 100. The sensor layer 200 may detect an external input applied from the outside. The external input may be a user's input. The user's input may include various types of external inputs such as a portion of the user's body, light, heat, a pen, or a pressure, etc. The sensor layer 200 may be referred to as a sensor, an input sensing layer, or an input sensing panel. The sensor layer 200 may include a sensor base layer 201, a first sensor conductive layer 202, a sensor insulating layer 203, a second sensor conductive layer 204, and a sensor cover layer 205.

The sensor base layer 201 may be disposed (e.g., directly disposed) on the display panel 100. The sensor base layer 201 may be an inorganic layer including at least one of silicon nitride, silicon oxynitride, or silicon oxide. In another example, the sensor base layer 201 may be an organic layer including an epoxy resin, an acrylic resin, or an imide-based resin. The sensor base layer 201 may have a single-layer structure or a multi-layer structure in which layers are stacked along the third direction DR3.

Each of the first sensor conductive layer 202 and the second sensor conductive layer 204 may have a single-layer structure or may have a multi-layer structure in which layers are stacked along the third direction DR3.

The conductive layer of the single layer structure may include a metal layer or a transparent conductive layer. The metal layer may include molybdenum (Mo), silver (Ag), titanium (Ti), copper (Cu), aluminum (Al), or an alloy thereof. The transparent conductive layer may include a transparent conductive oxide such as indium tin oxide (ITO), indium zinc oxide (IZO), zinc oxide (ZO), or indium zinc tin oxide (IZTO). In another example, the transparent conductive layer may include a conductive polymer such as poly (3,4-ethylenedioxythiophene) (PEDOT), metal nanowires, and graphene.

The conductive layer of the multilayer structure may include metal layers. The metal layers may include, for example, a titanium layer/an aluminum layer/a titanium layer. The conductive layer having a multilayer structure may include at least one metal layer and at least one transparent conductive layer.

The sensor insulating layer 203 may be disposed between the first sensor conductive layer 202 and the second sensor conductive layer 204. The sensor insulating layer 203 may include an inorganic film. The inorganic film may include at least one of aluminum oxide, titanium oxide, silicon oxide, silicon nitride, silicon oxynitride, zirconium oxide, or hafnium oxide.

In another example, the sensor insulating layer 203 may include an organic film. The organic film may include at least one of acrylate-based resin, methacrylate-based resin, polyisoprene, vinyl-based resin, epoxy-based resin, urethane-based resin, cellulose-based resin, siloxane-based resin, polyimide-based resin, polyamide-based resin, or perylene-based resin.

The sensor cover layer 205 may be disposed on the sensor insulating layer 203 and may cover the second sensor conductive layer 204. The second sensor conductive layer 204 may include a conductive pattern layer. The sensor cover layer 205 may cover the conductive pattern layer so as to reduce or eliminate a probability of damage to the conductive pattern layer in a subsequent process. The sensor cover layer 205 may include an inorganic material. For example, the sensor cover layer 205 may include silicon nitride. However, embodiments are not limited thereto. In another example, the sensor cover layer 205 may be omitted.

The anti-reflective layer 300 may be disposed on the sensor layer 200. The anti-reflective layer 300 may include a division layer 310, color filters 320 and 320-S, and a planarization layer 330.

The division layer 310 may overlap the conductive pattern layer of the second sensor conductive layer 204. The sensor cover layer 205 may be disposed between the division layer 310 and the second sensor conductive layer 204. The division layer 310 may prevent reflection of external light from the second sensor conductive layer 204. A material of the division layer 310 is not limited as long as a material can absorb light. The division layer 310 is a layer having a black color. In an embodiment, the division layer 310 may include a black coloring agent. The black coloring agent may include black dyes and black pigments. The black coloring agent may include carbon black, a metal such as chromium, or an oxide thereof.

Division openings may be defined in the division layer 310. The division openings may overlap the light-emitting layer EL and the photoelectric conversion layer PL, respectively. The color filters 320 and 320-S may be arranged so as to correspond to the division openings. The color filters 320 and 320-S may include the first color filter 320 and the second color filter 320-S. The first color filter 320 may transmit light provided from a portion of the light-emitting layer EL overlapping the first color filter 320 therethrough. The second color filter 320-S may be disposed so as to overlap the photoelectric conversion layer PL. Light may transmit through the color filter 320-S and then may be provided to the photoelectric conversion layer PL.

The planarization layer 330 may cover the division layer 310 and the color filters 320 and 320-S. The planarization layer 330 may include an organic material. A top surface (or upper surface) of the planarization layer 330 may be flat. In another example, the planarization layer 330 may be omitted.

In an embodiment, the anti-reflective layer 300 may include a reflection adjustment layer instead of the color filters 320 and 320-S. For example, the color filters 320 and 320-S may be omitted, and the reflection adjustment layer may be added to an area in which the color filters 320 and 320-S are omitted. The reflection adjustment layer may selectively absorb a portion of light reflected from an inside of the display panel and/or an electronic device or light incident thereto from an outside out of the display panel and/or the electronic device.

In an example, the reflection adjustment layer may absorb a first wavelength range of about 490 nm to about 505 nm and a second wavelength range of about 585 nm to about 600 nm, and thus may have transmittance of about 40% or lower of light in the first wavelength range and the second wavelength range. The reflection adjustment layer may absorb light of a wavelength out of a wavelength range of red, green, and blue light beams emitted from the light-emitting layer EL. For example, the reflection adjustment layer may absorb light of a wavelength that does not belong to a wavelength range of the red light beam, the green light beam, or the blue light beam emitted from the light-emitting layer EL, thereby preventing or minimizing decrease in luminance of the display panel and/or the electronic device. Further, degradation of light-emitting efficiency of the display panel and/or the electronic device may be prevented or minimized, and visibility may be improved.

The reflection adjustment layer may be formed as an organic material layer including dyes, pigments, or combinations thereof. The reflection adjustment layer may include tetraazaporphyrin (TAP)-based compound, porphyrin-based compound, metal porphyrin-based compound, oxazine-based compound, squarylium-based compound, triarylmethane-based compound, polymethine-based compound, anthraquinone-based compound, phthalocyanine-based compound, azo-based compound, perylene-based compound, xanthene-based compound, diimmonium-based compound, dipyrromethene-based compound, cyanine-based compound, or combinations thereof.

In an embodiment, the reflection adjustment layer may have a transmittance of about 64% to about 72%. The transmittance of the reflection adjustment layer may be adjusted according to a content of the pigment and/or the dye included in the reflection adjustment layer.

Figure 7:
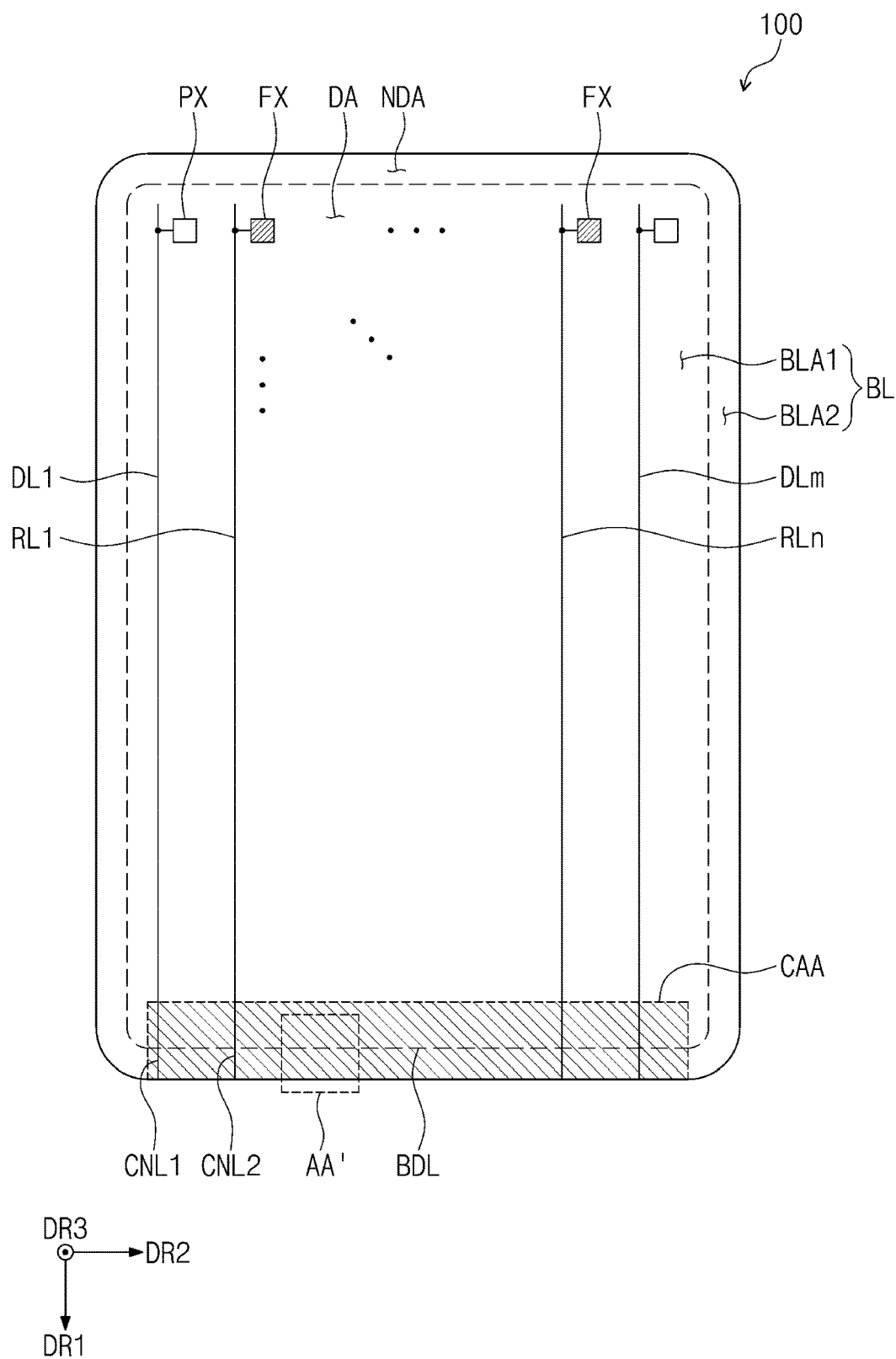
FIG. 7 is a schematic plan view of a display panel according to an embodiment.

FIG. 7 is a schematic plan view of the display panel 100 according to an embodiment.

Referring to FIG. 7, the display panel 100 may include the display area DA and the non-display area NDA. A first area BLA1 of base layer BL may overlap the display area DA, and a second area BLA2 of the base layer BL may overlap the non-display area NDA. For example, the first area BLA1 of the base layer BL may be a base surface on which the components arranged in the display area DA are provided, and the second area BLA2 of the base layer BL may be a base surface on which the components arranged in the non-display area NDA are provided.

The pixels PX and the sensors FX may be disposed on the base layer BL. For example, the pixels PX and the sensors FX may be disposed on the first area BLA1. The data lines DL1 to DLm may be disposed in the display area DA and may be respectively connected (e.g., electrically connected) to the pixels PX. The read-out lines RL1 to RLh may be disposed in the display area DA and may be respectively connected (e.g., electrically connected) to the sensors FX.

The display panel 100 may include first connection lines CNL1 and second connection lines CNL2 disposed on the base layer BL. The first connection lines CNL1 and the second connection lines CNL2 may be disposed in the non-display area NDA. The first connection lines CNL1 may be connected (e.g., electrically connected) to the data lines DL1 to DLm in a one-to-one correspondence. The second connection lines CNL2 may be connected (e.g., electrically connected) to the read-out lines RL1 to RLh in a one-to-one correspondence. Accordingly, the first connection lines CNL1 may be respectively connected (e.g., electrically connected) to the pixels PX, and the second connection lines CNL2 may be respectively connected (e.g., electrically connected) to the sensors FX.

In the display panel 100, an attachable area CAA to which a circuit film COF (refer to FIG. 10) is attached may be defined. The circuit film COF may be disposed below the display panel 100 and may be attached to an exposed pads PD (refer to FIG. 9) not covered with the rear surface of the display panel 100. Therefore, the attachable area CAA may overlap not only a portion of the non-display area NDA but also a portion of the display area DA. The pads PD may be arranged in the attachable area CAA. According to an embodiment, the pads PD may be disposed on the rear surface of the display panel 100. Therefore, an area size of the non-display area 1000NA (refer to FIG. 1) of the display device 1000 (refer to FIG. 1) may be reduced.

Figure 8:
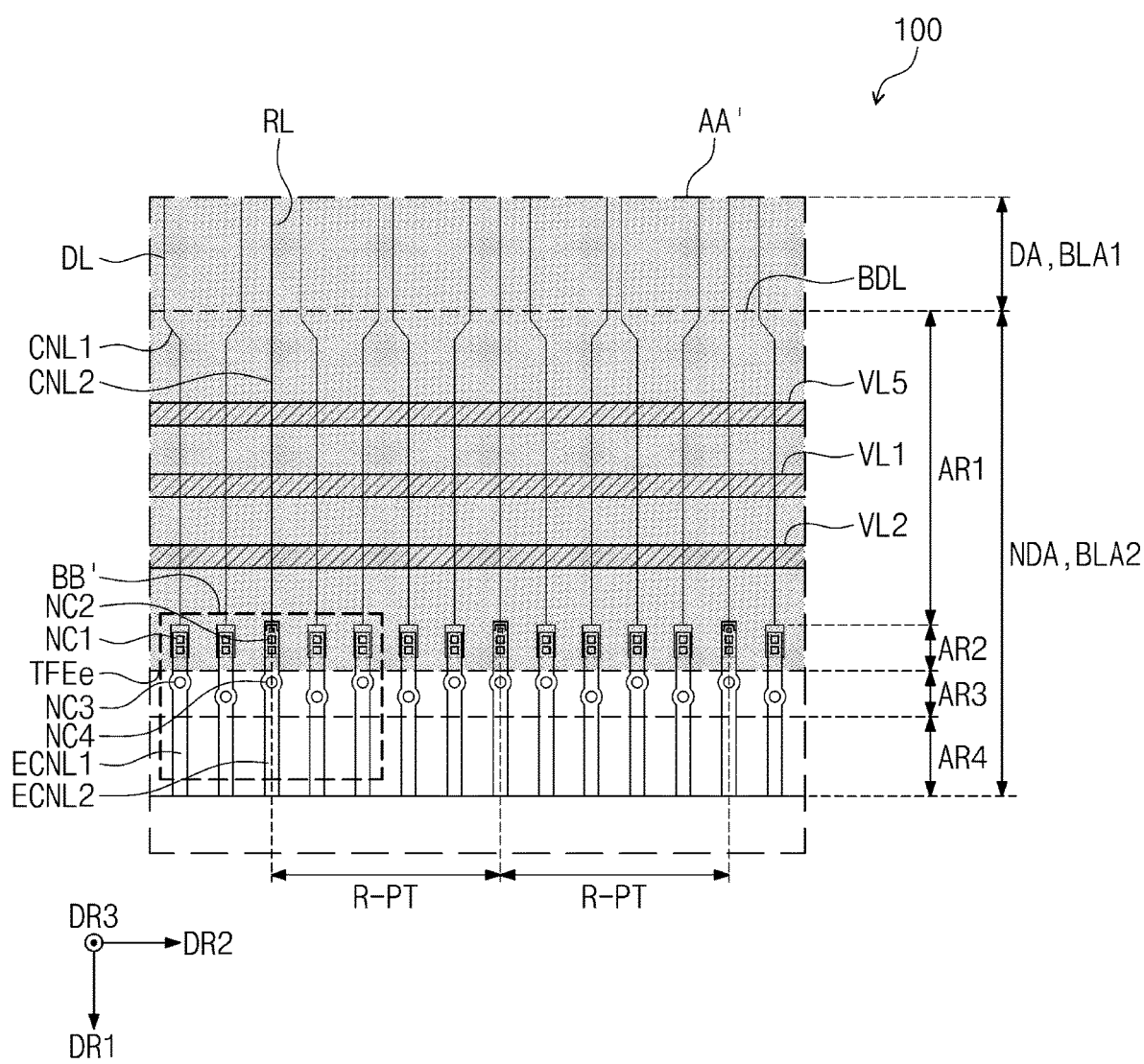
FIG. 8 is an enlarged schematic plan view showing an area AA' as shown in FIG. 7.

FIG. 8 is an enlarged schematic plan view showing an area AA' as shown in FIG. 7.

Referring to FIG. 7 and FIG. 8, the non-display area NDA may include first to fourth non-display areas AR1, AR2, AR3, and AR4 sequentially arranged in a direction away from a boundary BDL between the non-display area NDA and the display area DA.

Each of the first connection lines CNL1 may extend from each corresponding one of the data lines DL, and each of the second connection lines CNL2 may extend from each corresponding one of the read-out lines RL. The first connection lines CNL1 and the data lines DL may be disposed in/on the same layer or in/on different layers. Further, the second connection lines CNL2 and the read-out lines RL may be disposed in/on the same layer or in/on different layers. The first connection lines CNL1 and the second connection lines CNL2 may be disposed in/on different layers.

At least one portion of each of the first connection lines CNL1 and the second connection lines CNL2 may extend in the first non-display area AR1 along the first direction DR1. The first non-display area AR1 may be referred to as a fan-out area.

In a plan view, the first connection lines CNL1 may not overlap the second connection lines CNL2. In a plan view, the first connection lines CNL1 and the second connection lines CNL2 may be spaced apart from each other. Further, the first connection lines CNL1 may be disposed in/on a different layer from a layer in/on which the second connection lines CNL2 are disposed. Accordingly, coupling between the first connection lines CNL1 and the second connection lines CNL2 may be reduced or eliminated. For example, noise generated in a sensed signal provided to the second connection lines CNL2 due to a voltage provided via the first connection lines CNL1 may be reduced. Thus, fingerprint sensing sensitivity and fingerprint sensing accuracy may be improved.

According to an embodiment, a structure for reducing the coupling between the first connection lines CNL1 and the second connection lines CNL2 may be applied. For example, the second connection lines CNL2 may extend in a direction perpendicular to an arrangement direction of the first connection lines CNL1 and the second connection lines CNL2. Accordingly, each of the second connection lines CNL2 may have a straight shape extending along the first direction DR1. For example, a spacing between each of the first connection lines CNL1 and each of the second connection lines CNL2 in a plan view may be further increased, compared to that in a case where the second connection lines CNL2 extend in an oblique direction with respect to the arrangement direction of the first connection lines CNL1 and the second connection lines CNL2. Accordingly, the coupling between the first connection lines CNL1 and the second connection lines CNL2 may be further reduced.

The second connection lines CNL2 may be spaced apart from each other by the same first pitch (or same first distance) R-PT. Accordingly, portions of the first connection lines CNL1 may be arranged between the two immediately-adjacent second connection lines CNL2 spaced apart from each other by the first pitch (or first distance) R-PT according to a certain arrangement rule. FIG. 8 shows an example in which four first connection lines CNL1 are arranged between the two immediately-adjacent second connection lines CNL2. However, embodiments are not limited thereto.

The display panel 100 may further include first contact lines ECNL1 and second contact lines ECNL2. The first contact lines ECNL1 and the second contact lines ECNL2 may be disposed in the second to fourth non-display areas AR2, AR3, and AR4.

The first contact lines ECNL1 may be connected (e.g., electrically connected) to the first connection lines CNL1, respectively. The second contact lines ECNL2 may be connected (e.g., electrically connected) to the second connection lines CNL2, respectively. The first contact lines ECNL1 may be disposed in/on a different layer from a layer in/on which the first connection lines CNL1 are disposed. The second contact lines ECNL2 may be disposed in/on a different layer from a layer in/on which the second connection lines CNL2 are disposed. The first contact lines ECNL1 and the second contact lines ECNL2 may be disposed in/on the same layer.

Each of the first contact lines ECNL1 and each of the first connection lines CNL1 may be connected to each other via a first contact NC1 in the second non-display area AR2. Each of the second contact lines ECNL2 and each of the second connection lines CNL2 may be connected to each other via a second contact NC2 in the second non-display area AR2.

Each of the first contact lines ECNL1 may include each of third contacts NC3 disposed in the third non-display area AR3. Each of the second contact lines ECNL2 may include each of fourth contacts NC4 disposed in the third non-display area AR3. The first contact lines ECNL1 may be respectively connected (e.g., electrically connected) to first pads PD1 (refer to FIG. 9) via the third contacts NC3. The second contact lines ECNL2 may be respectively connected (e.g., electrically connected) to second pads PD2 (refer to FIG. 9) via the fourth contacts NC4.

The third contacts NC3 and fourth contacts NC4 may be arranged in a zigzag pattern along the second direction DR2. The third contacts NC3 and the fourth contacts NC4 may be arranged in a staggered manner so that two contacts adjacent to each other may not be aligned with each other along the second direction DR2.

The first contact lines ECNL1 and the second contact lines ECNL2 may extend into the fourth non-display area AR4. A pre-display panel may further include a test circuit, in which a spacing between the test circuit and the display area DA may be larger than a spacing between the fourth non-display area AR4 and the display area DA. After a test of the pre-display panel is completed, and in case that a portion of the pre-display panel in which the test circuit is disposed is removed, a portion of the fourth non-display area AR4 may be cut.

Figure 9:
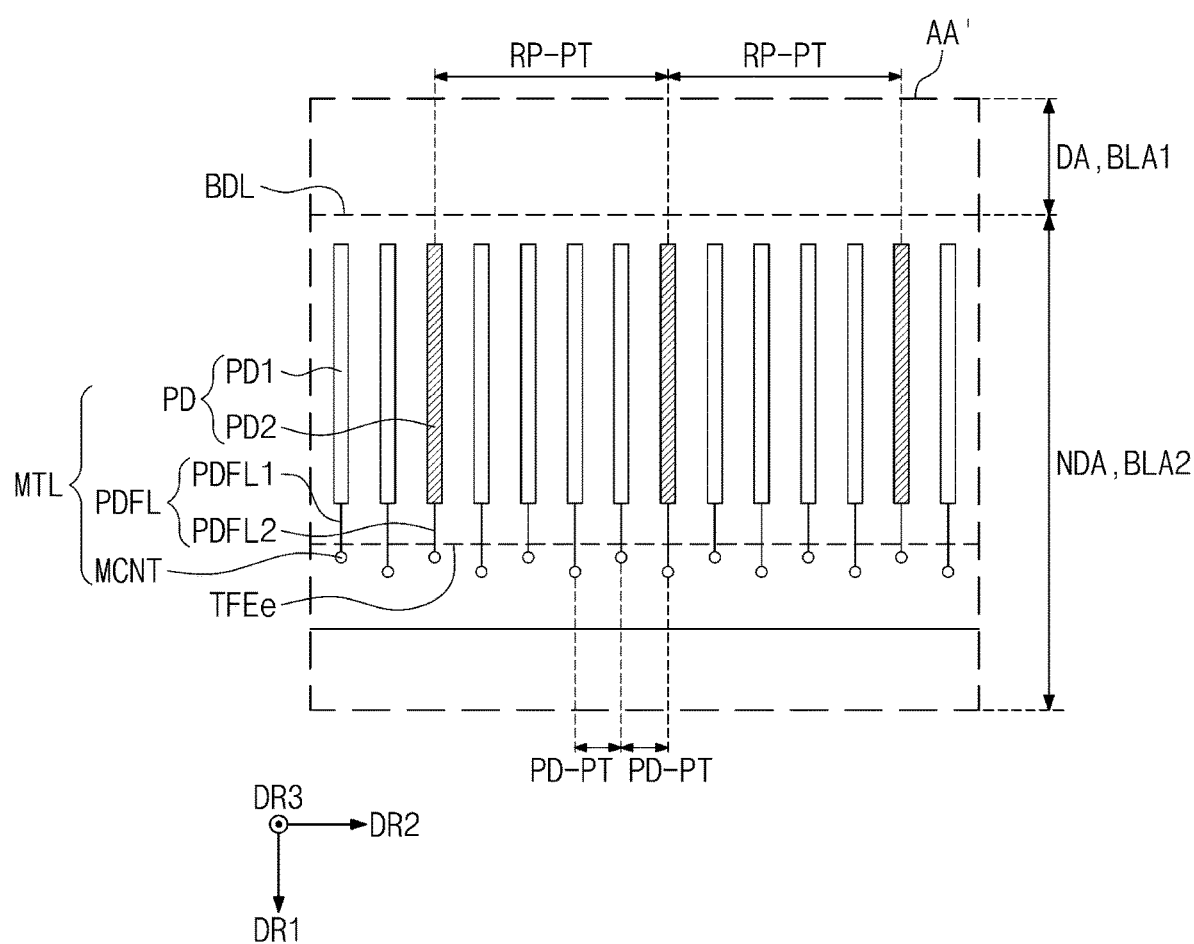
FIG. 9 is a schematic plan view showing a conductive layer corresponding to the area AA' as shown in FIG. 7.

FIG. 9 is a schematic plan view showing a conductive layer MTL corresponding to the area AA' as shown in FIG. 7.

Referring to FIG. 7, FIG. 8, and FIG. 9, the base layer BL may include the conductive layer MTL. The conductive layer MTL may include pads PD, extension lines PDFL, and contacts MCNT.

The pads PD may be arranged so as to be spaced apart from each other along the second direction DR2. The pads PD may include first pads PD1 respectively connected (e.g., electrically connected) to the first connection lines CNL1 and second pads PD2 respectively connected (e.g., electrically connected) to the second connection lines CNL2. In FIG. 9, the second pads PD2 are indicated by diagonal hatching to clarify distinction between the first pads PD1 and the second pads PD2. The second pads PD2 may be spaced apart from each other by the same pitch (or same distance) RP-PT and may be arranged in a corresponding manner to the second connection lines CNL2.

The extension lines PDFL may protrude from the pads PD, respectively. The extension lines PDFL may include first extension lines PDFL1 respectively protruding from the first pads PD1, and second extension lines PDFL2 respectively protruding from the second pads PD2. The first extension lines PDFL1 may be respectively connected (e.g., electrically connected) to the first pads PD1 and may be disposed in/on the same layer as a layer in/on which the first pads PD1 are disposed. The second extension lines PDFL2 may be respectively connected (e.g., electrically connected) to the second pads PD2 and may be disposed in/on the same layer as a layer in/on which the second pads PD2 are disposed.

The contacts MCNT contacting the first contact lines ECNL1 and the second contact lines ECNL2 may be respectively connected to end portions of the extension lines PDFL. A width of each of the contacts MCNT may be greater than a width of each of the extension lines PDFL. Therefore, the contacts MCNT may be stably connected to the third contacts NC3 of the first contact lines ECNL1 and the fourth contacts NC4 of the second contact lines ECNL2, respectively.

According to an embodiment, the pads PD may be closer to the display area DA than the contacts MCNT may be. Accordingly, a line along which the display panel 100 is cut may be positioned adjacent to the contacts MCNT without considering an area size where the pads PD are to be disposed. Accordingly, the display device 1000 (refer to FIG. 1) in which an area size of the non-display area 1000NA (refer to FIG. 1) is further reduced may be implemented.

Figure 10:
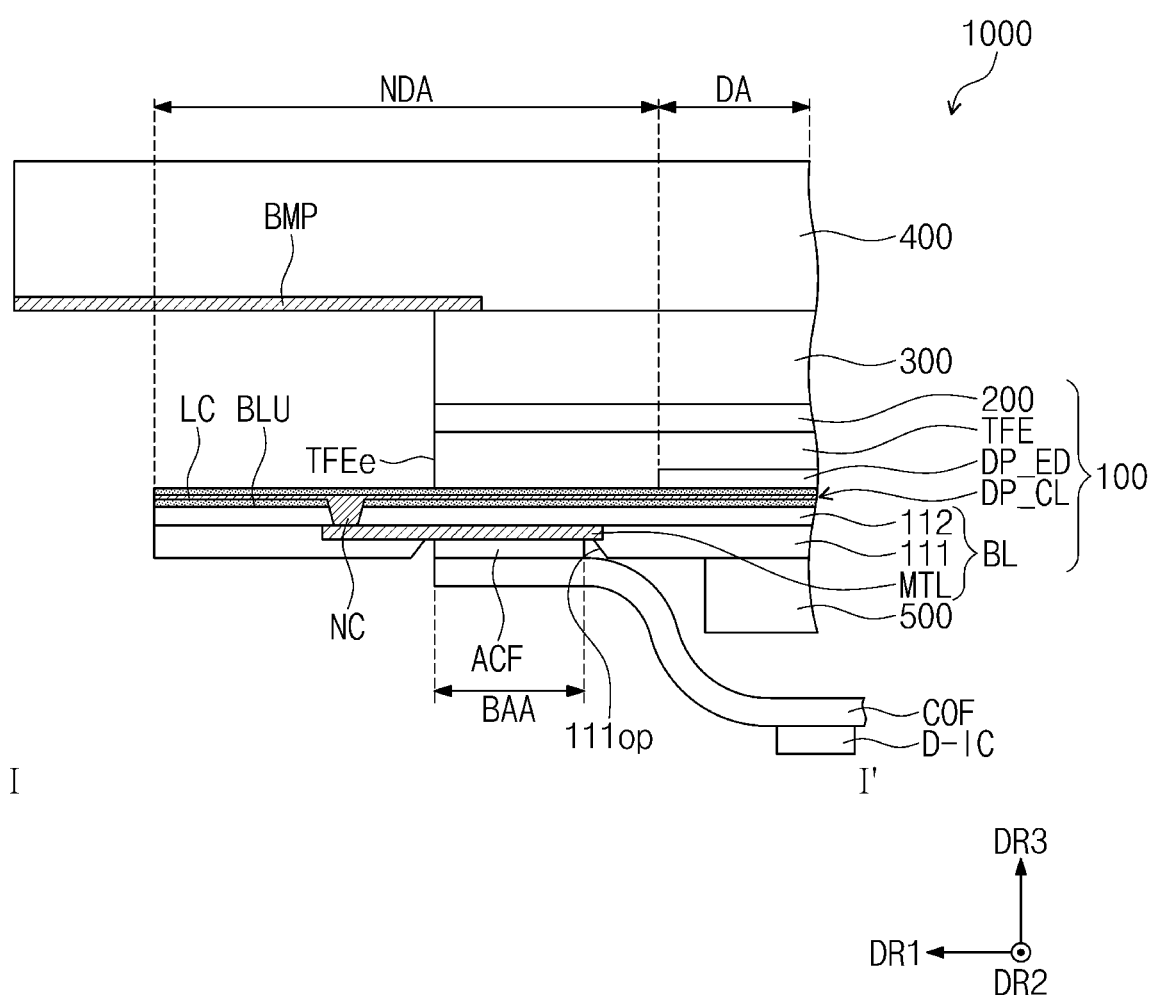
FIG. 10 is a schematic cross-sectional view showing a configuration of a portion of a display device according to an embodiment as taken along a line I-I' of FIG. 1.

FIG. 10 is a schematic cross-sectional view showing a configuration of a portion of a display device according to an embodiment as taken along a line I-I' of FIG. 1.

Referring to FIG. 9 and FIG. 10, the base layer BL may have a multi-layer structure. For example, the base layer BL may include a first sub-base layer 111, a second sub-base layer 112 disposed on the first sub-base layer 111, and the conductive layer MTL disposed between the first sub-base layer 111 and the second sub-base layer 112. As described in FIG. 9, the conductive layer MTL may include the pads PD, the extension lines PDFL, and the contacts MCNT. For example, the pads PD may be disposed under a top surface (or upper surface) BLU of the base layer BL.

Each of the first and second sub-base layers 111 and 112 may include a polyimide-based resin. Further, each of the first and second sub-base layers 111 and 112 may include at least one of acrylate-based resin, methacrylate-based resin, polyisoprene-based resin, vinyl-based resin, epoxy epoxy-based resin, urethane-based resin, cellulose-based resin, siloxane-based resin, polyamide-based resin, or perylene-based resin. As used herein, "~-based resin" means including a functional group of "~".

The conductive layer MTL may have a single-layer structure or a multi-layer structure in which layers are stacked along the third direction DR3. For example, the conductive layer MTL having the single-layer structure may include molybdenum, silver, titanium, copper, aluminum, or alloys thereof. The conductive layer MTL having the multi-layer structure may include metal layers. The metal layers may include, for example, an aluminum layer/a titanium layer, or may include, for example, a titanium layer/an aluminum layer/a titanium layer.

Referring to FIG. 8 and FIG. 10, the circuit layer DP_CL may include a line group LC. The line group LC may include the first connection lines CNL1, the second connection lines CNL2, the first contact lines ECNL1, and the second contact lines ECNL2. Components NC in the line group LC extending through the second sub-base layer 112 may be the first contact lines ECNL1 and the second contact lines ECNL2. For example, the third contacts NC3 of the first contact lines ECNL1 and the fourth contacts NC4 of the second contact lines ECNL2 may extend through the second sub-base layer 112 and be connected (e.g., electrically connected) to the conductive layer MTL.

An opening 111op exposing a portion of the conductive layer MTL may be defined in the first sub-base layer 111. The opening 111op may be formed in a bottom surface of the base layer BL. A conductive adhesive layer ACF may be attached to the exposed portion of the conductive layer MTL. The circuit film COF on which a chip D-IC is mounted may be connected (e.g., electrically connected) to the display panel 100 via the conductive adhesive layer ACF. The chip D-IC may include the data driver 100C2 (refer to FIG. 3) and the sensor controller 10006 (refer to FIG. 3). The chip D-IC may be referred to as a sensor-data integrated IC.

FIG. 10 shows that the chip D-IC is mounted on a bottom surface of the circuit film COF as an example. However, the chip D-IC may be mounted on a top surface (or upper surface) of the circuit film COF. Further, the conductive adhesive layer ACF may be an anisotropic conductive film. However, embodiments are not limited thereto. In another example, the conductive adhesive layer ACF may be omitted. For example, the circuit film COF may contact (e.g., directly contact) the conductive layer MTL and may be connected (e.g., electrically connected) to the display panel 100.

In an embodiment, the pads PD may include a portion of the conductive layer MTL exposed through the opening defined in the first sub-base layer 111. In a plan view, an edge portion TFEe of the encapsulation layer TFE may overlap each of the extension lines PDFL. In a plan view, each of the pads PD may overlap the encapsulation layer TFE, and the contacts MCNT may be spaced apart from the encapsulation layer TFE. For example, an attachment area BAA to which the conductive adhesive layer ACF is attached may overlap the non-display area NDA and may overlap the encapsulation layer TFE.

The display device 1000 may further include a window 400 disposed on the anti-reflective layer 300. The window 400 may include a bezel pattern layer BMP. The bezel pattern layer BMP may be formed as a colored light blocking film and may be coated on a base layer of the window 400. The bezel pattern layer BMP may overlap the non-display area NDA.

The display device 1000 may further include a protective layer 500 disposed under the display panel 100. The protective layer 500 may block or absorb light incident on the display panel 100. For example, the protective layer 500 may be formed as a colored film. However, embodiments are not limited thereto.

Figure 11:
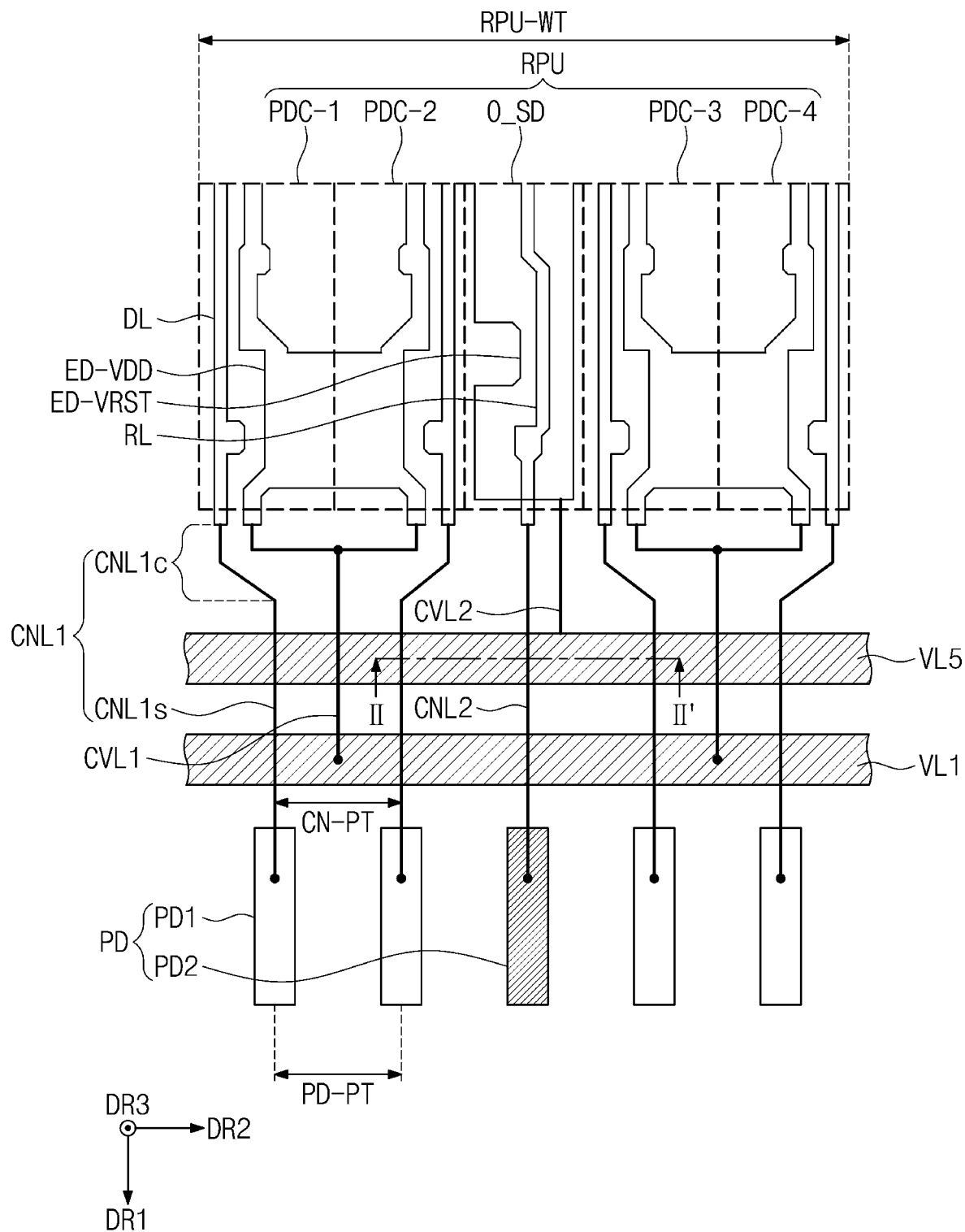
FIG. 11 is a schematic plan view showing some components of a display panel according to an embodiment.

FIG. 11 is a schematic plan view showing some components of a display panel according to an embodiment.

Referring to FIG. 3 and FIG. 11, the display panel 100 may include repeat units RPU repeatedly arranged along each of the first direction DR1 and the second direction DR2. FIG. 11 representatively shows a repeat unit RPU.

The repeat unit RPU may include four pixel drive circuits PDC-1, PDC-2, PDC-3, and PDC-4, and the sensor drive circuit O_SD. The sensor drive circuit O_SD may be disposed between a combination of two pixel drive circuits PDC-1 and PDC-2 and a combination of two pixel drive circuits PDC-3 and PDC-4.

FIG. 11 representatively shows the data lines DL included in the pixel drive circuits PDC-1, PDC-2, PDC-3, and PDC-4 and the sensor drive circuit O_SD, a first voltage electrode ED-VDD to which the first drive voltage ELVDD (refer to FIG. 5) is supplied, the read-out line RL, and a second voltage electrode ED-VRST to which the reset voltage Vrst (refer to FIG. 5) is supplied.

The first connection lines CNL1 may be connected (e.g., electrically connected) to the data lines DL. Each of the first connection lines CNL1 may include a straight portion CNL1s extending along the first direction DR1, and a connection portion CNL1c disposed between the straight portion CNL1s and the display area DA.

In a plan view, the straight portions CNL1s and the second connection line CNL2 may be arranged along the second direction DR2 intersecting the first direction DR1 under a certain rule and may be spaced from each other by the same pitch (or same distance) CN-PT. N straight portions among the straight portions CNL1s, one second connection line CNL2 among the second connection lines CNL2, and N straight portions among the straight portions CNL1s may be sequentially and repeatedly arranged along the second direction DR2 intersecting the first direction DR1, where N is a positive integer greater than or equal to 2. In an embodiment as shown in FIG. 11, "X" may be two. Each of the connection portions CNL1c may be partially bent so that the straight portions CNL1s and the second connection line CNL2 may be spaced from each other by the same pitch (or same distance) CN-PT.

In a corresponding manner to an arrangement relationship between the straight portions CNL1s and the second connection line CNL2, the first pads PD1 and the second pads PD2 may be arranged according to a certain rule and may be spaced from each other by the same pitch (or same distance) PD-PT. For example, two first pads PD1, one second pad PD2, and two first pads PD1 may be sequentially and repeatedly arranged along the second direction DR2.

The pitch (or distance) PD-PT between the first and second pads PD1 and PD2 may be equal to a value obtained by dividing a width RPU-WT in the second direction DR2 of the repeat unit RPU by the number of the first and second pads PD1 and PD2. For example, the pitch (or distance) PD-PT between the first and second pads PD1 and PD2 may be equal to a value obtained by dividing the width RPU-WT by 5.

The display panel 100 may further include at least one voltage line VL1 and VL5 overlapping the first connection lines CNL1 and the second connection line CNL2 in a plan view. In FIG. 11, the first drive voltage line VL1 and the third initialization voltage line VL5 are illustrated as an example.

Each of the first drive voltage line VL1 and the third initialization voltage line VL5 may be disposed in/on a different layer from a layer in/on which the first connection lines CNL1 are disposed and from a layer in/on which the second connection line CNL2 is disposed. For example, each of the first drive voltage line VL1 and the third initialization voltage line VL5 may be disposed between a layer in which the first connection lines CNL1 are disposed and a layer in which the second connection line CNL2 is disposed. A direct current (DC) voltage may be provided to each of the first drive voltage line VL1 and the third initialization voltage line VL5, and accordingly, each of the first drive voltage line VL1 and the third initialization voltage line VL5 may function as a shielding electrode. Therefore, coupling between the first connection lines CNL1 and the second connection lines CNL2 may be further reduced due to the first drive voltage line VL1 and the third initialization voltage line VL5. Thus, noise generated in the sensed signal provided via the second connection lines CNL2 may be reduced, and thus, fingerprint sensing sensitivity and fingerprint sensing accuracy may be improved.

The display panel 100 may further include a first voltage connection line CVL1 electrically connecting the first drive voltage line VL1 and the first voltage electrode ED-VDD to each other, and a second voltage connection line CVL2 electrically connecting the third initialization voltage line VL5 and the second voltage electrode ED-VRST to each other.

The first voltage connection line CVL1 may intersect the third initialization voltage line VL5 and be connected (e.g., electrically connected) to the first voltage electrode ED-VDD. Accordingly, the first voltage connection line CVL1 may be disposed in/on a different layer from a layer in/on which the third initialization voltage line VL5 is disposed. In an embodiment, the first voltage connection line CVL1 and the second connection line CNL2 may be disposed in/on the same layer, or the first voltage connection line CVL1 and the first connection line CNL1 may be disposed in/on the same layer.

The second voltage connection line CVL2 may extend so as to protrude from the third initialization voltage line VL5. For example, the second voltage connection line CVL2 may be disposed in/on the same layer as a layer in/on which at least one of layers of the third initialization voltage line VL5 is disposed. For example, the second voltage connection line CVL2 may be disposed between the sixth insulating layer 60 (refer to FIG. 6) and the seventh insulating layer 70 (refer to FIG. 6). However, embodiments are not limited thereto.

Figure 12A:
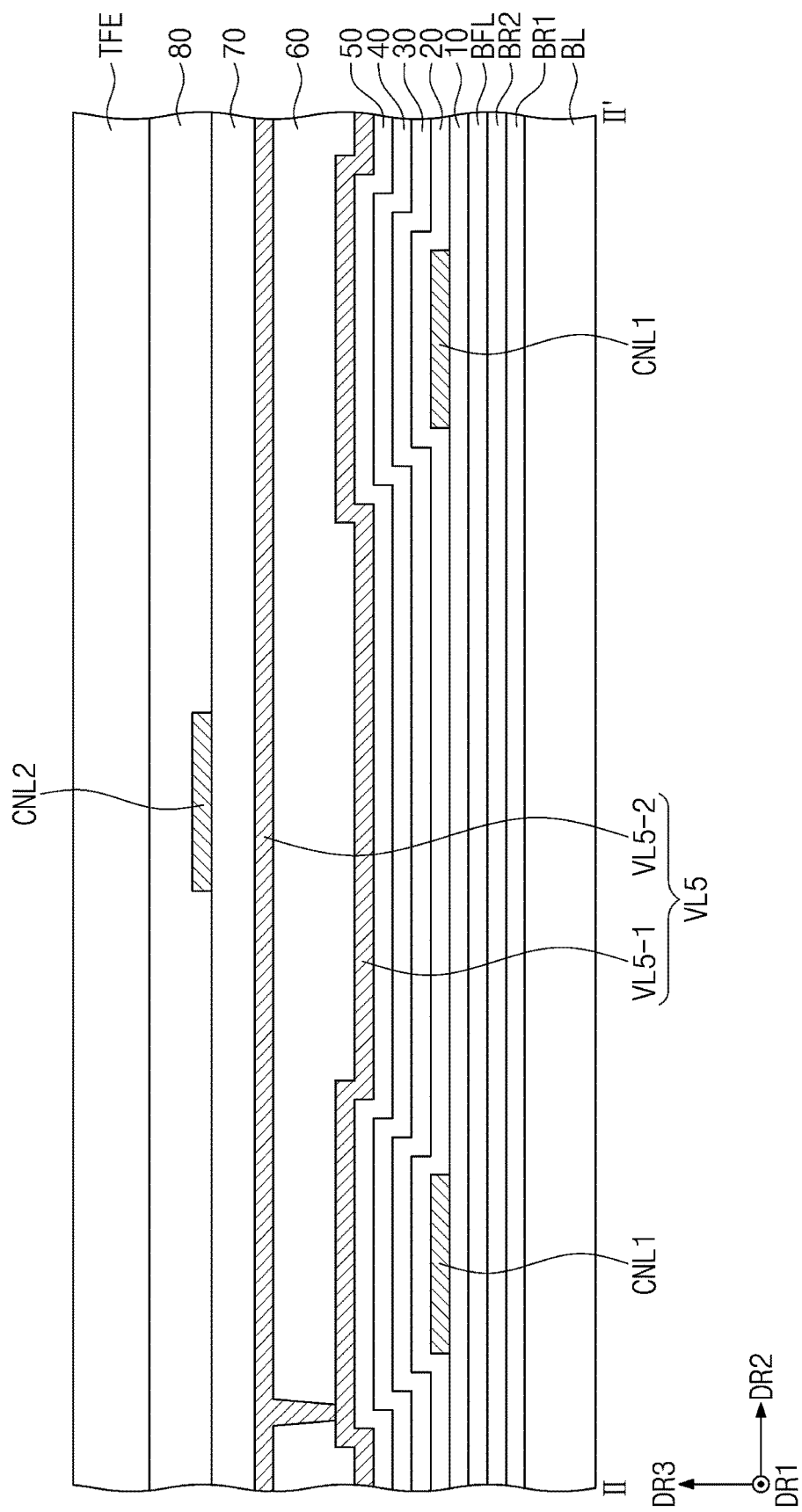
FIG. 12A is a schematic cross-sectional view showing a display panel according to an embodiment as taken along a line II-II' of FIG. 11.

FIG. 12A is a schematic cross-sectional view showing a display panel according to an embodiment as taken along a line II-II' of FIG. 11.

Referring to FIG. 6, FIG. 11 and FIG. 12A, the third initialization voltage line VL5 is representatively described. The first drive voltage line VL1 may have substantially the same structure as that of the third initialization voltage line VL5, and thus, a description thereof is omitted for descriptive convenience.

The first connection lines CNL1 may be disposed between the first insulating layer 10 and the second insulating layer 20. For example, the first connection lines CNL1 may be disposed in/on the same layer as a layer in/on which the third electrode G1 of the first transistor T1 is disposed. The second connection lines CNL2 may be disposed between the seventh insulating layer 70 and the eighth insulating layer 80. The second connection lines CNL2 may be disposed in/on the same layer as a layer in/on which the third connection electrode CNE30 is disposed. The second connection lines CNL2 may have a multi-layer structure in which a titanium layer, an aluminum layer, and a titanium layer are stacked. However, embodiments are not limited thereto. For example, each of the second connection lines CNL2 may include a transparent conductive material. Each of the second connection lines CNL2 may include transparent conducting oxide (TCO).

At least one organic layer may be disposed between the first connection lines CNL1 and the second connection lines CNL2. In an embodiment as shown in FIG. 12A, two organic layers, for example, the sixth insulating layer 60 and the seventh insulating layer 70 may be disposed between the first connection lines CNL1 and the second connection lines CNL2. Accordingly, a spacing between a layer in which the first connection lines CNL1 are disposed and a layer in which the second connection lines CNL2 is disposed may be larger than or equal to a certain value. Accordingly, the coupling between the first connection lines CNL1 and the second connection lines CNL2 may be reduced.

Further, in a cross-sectional view, the third initialization voltage line VL5 may be disposed between the first connection lines CNL1 and the second connection lines CNL2. The third initialization voltage line VL5 may include a first sub-voltage line VL5-1, and a second sub-voltage line VL5-2 connected (e.g., electrically connected) to the first sub-voltage line VL5-1. The second sub-voltage line VL5-2 may be disposed in/on a layer different from a layer in/on which the first sub-voltage line VL5-1 is disposed. The first sub-voltage line VL5-1 may be disposed between the fifth insulating layer 50 and the sixth insulating layer 60, and the second sub-voltage line VL5-2 may be disposed between the sixth insulating layer 60 and the seventh insulating layer 70.

The third initialization voltage line VL5 may function as a shielding electrode. Therefore, the coupling between the first connection lines CNL1 and the second connection lines CNL2 may be additionally reduced due to the third initialization voltage line VL5. Thus, noise generated in the sensed signal provided via the second connection lines CNL2 may be reduced, and thus, fingerprint sensing sensitivity and fingerprint sensing accuracy may be improved.

Figure 12B:
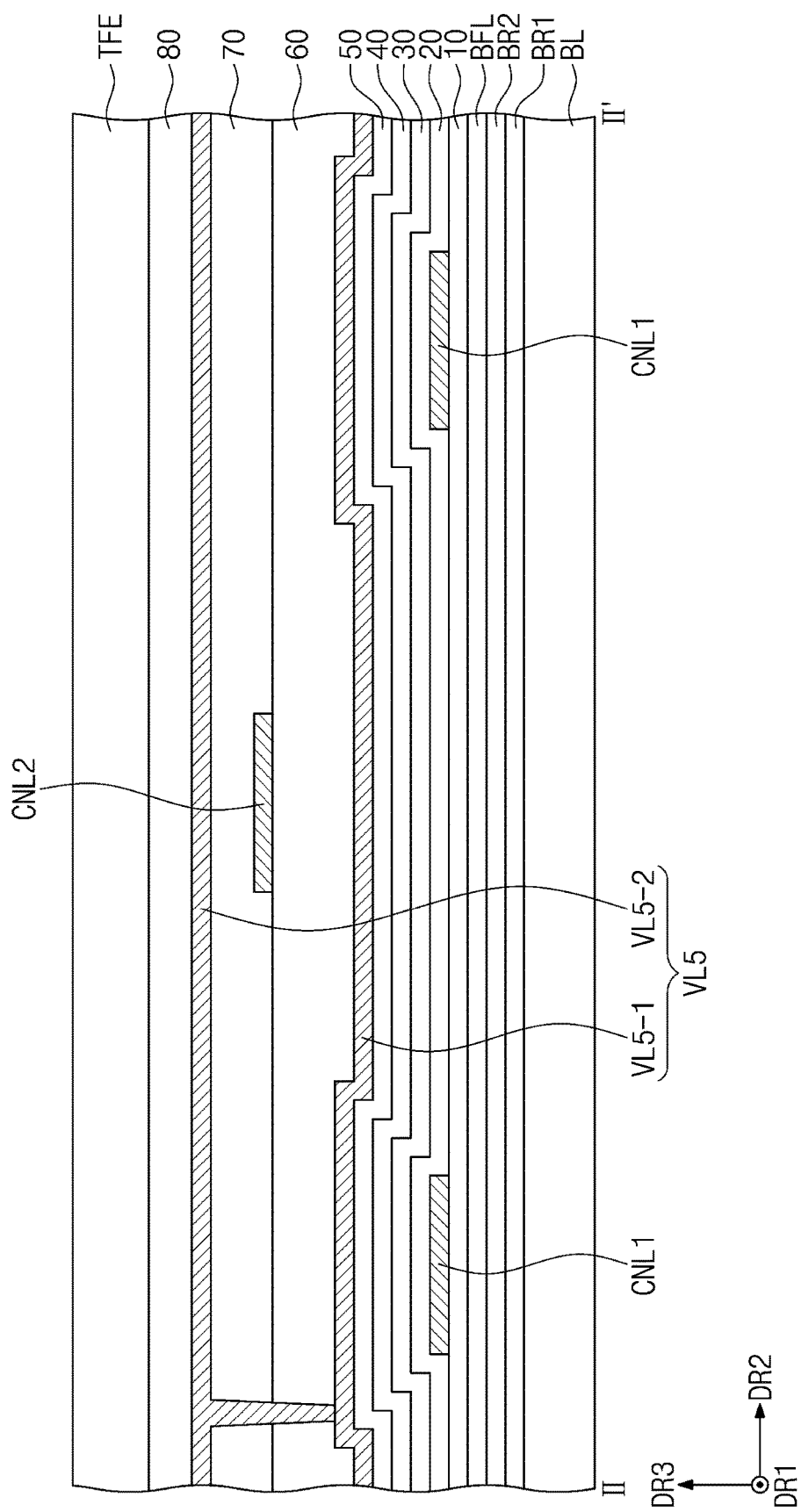
FIG. 12B is a schematic cross-sectional view showing a display panel according to an embodiment as taken along a line II-II' of FIG. 11.

FIG. 12B is a schematic cross-sectional view showing a display panel according to an embodiment as taken along a line II-II' of FIG. 11.

Referring to FIG. 12B, the first sub-voltage line VL5-1 may be disposed between the fifth insulating layer 50 and the sixth insulating layer 60, and the second sub-voltage line VL5-2 may be disposed between the seventh insulating layer 70 and the eighth insulating layer 80. The second connection lines CNL2 may be disposed between the first sub-voltage line VL5-1 and the second sub-voltage line VL5-2. The second connection lines CNL2 may be disposed between the sixth insulating layer 60 and the seventh insulating layer 70.

In an embodiment as shown in FIG. 12B, an organic layer, for example, the sixth insulating layer 60 may be disposed between the first connection lines CNL1 and the second connection lines CNL2. Accordingly, a spacing between a layer in which the first connection lines CNL1 may be disposed and a layer in which the second connection lines CNL2 are disposed may be equal to or greater than a certain spacing. Accordingly, the coupling between the first connection lines CNL1 and the second connection lines CNL2 may be reduced.

Figure 12C:
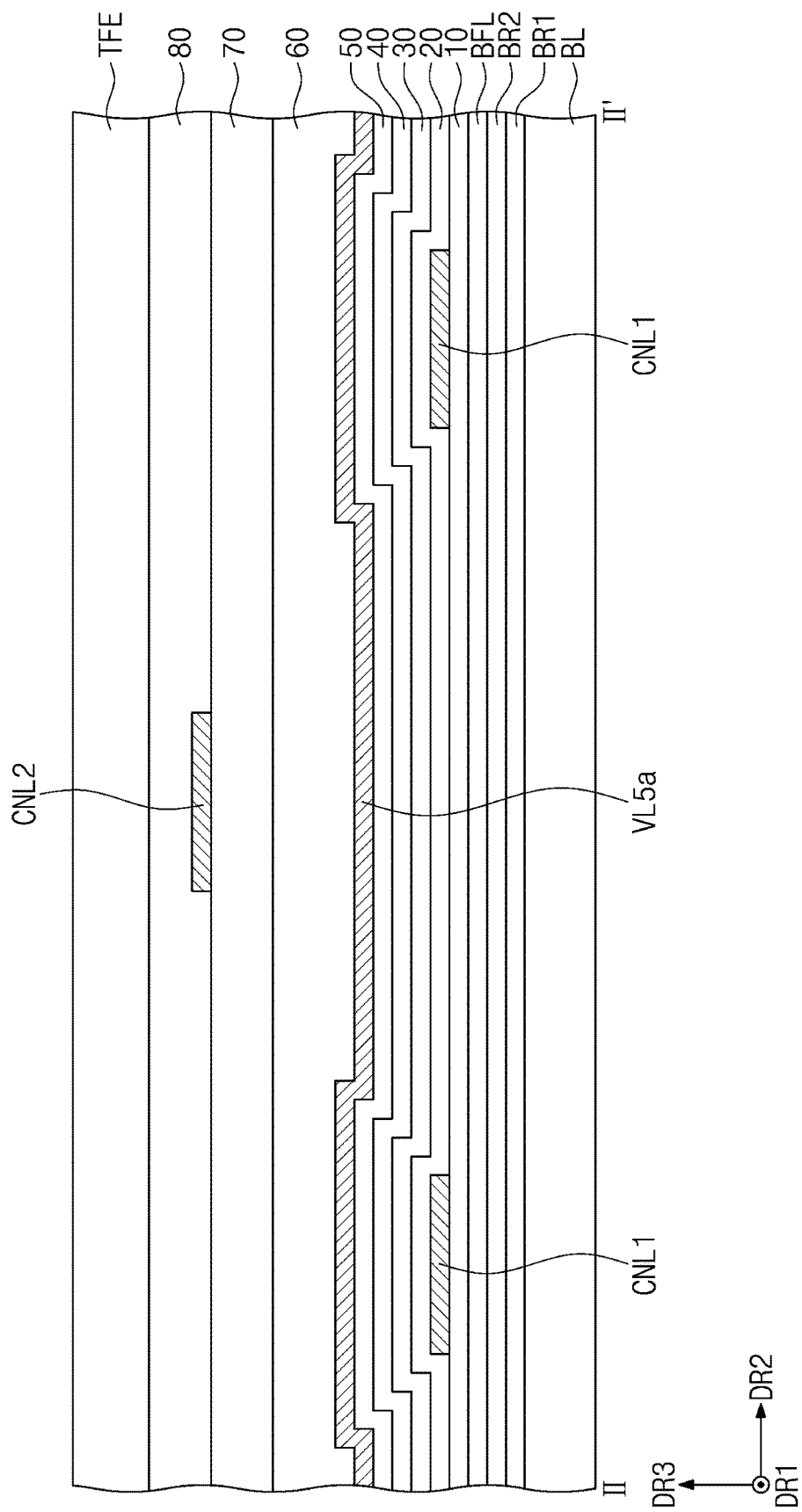
FIG. 12C is a schematic cross-sectional view showing a display panel according to an embodiment as taken along a line II-II' of FIG. 11.

FIG. 12C is a schematic cross-sectional view showing a display panel according to an embodiment as taken along a line II-II' of FIG. 11.

Referring to FIG. 11 and FIG. 12C, a third initialization voltage line VL5a may be disposed between the fifth insulating layer 50 and the sixth insulating layer 60. The second connection lines CNL2 may be disposed above the sixth insulating layer 60, and the first connection lines CNL1 may be disposed below the fifth insulating layer 50. For example, the second connection lines CNL2 may be disposed between the seventh insulating layer 70 and the eighth insulating layer 80. The first connection lines CNL1 may be disposed between the first insulating layer 10 and the second insulating layer 20. However, embodiments are not limited thereto.

Figure 12D:
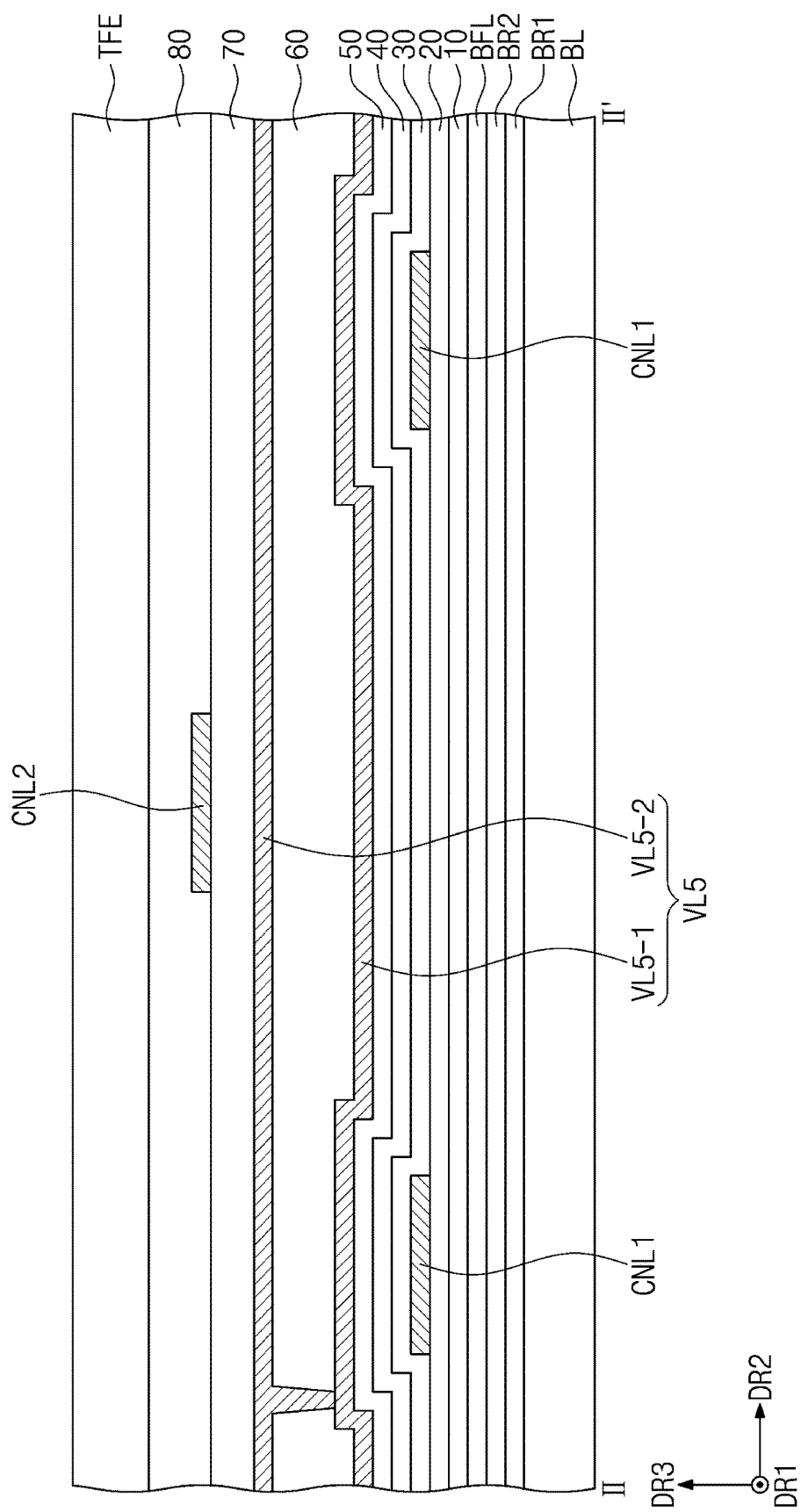
FIG. 12D is a schematic cross-sectional view showing a display panel according to an embodiment as taken along a line II-II' of FIG. 11.

FIG. 12D is a schematic cross-sectional view showing a display panel according to an embodiment as taken along a line II-II' of FIG. 11.

In FIG. 12D, the first connection lines CNL1 may be disposed between the second insulating layer 20 and the third insulating layer 30. The second connection lines CNL2 may be spaced from the first connection lines CNL1 in case that the third initialization voltage line VL5 are disposed between the first and second connection lines CNL1 and CNL2. For example, the second connection lines CNL2 are illustrated as being disposed between the seventh insulating layer 70 and the eighth insulating layer 80 as an example. However, embodiments are not limited thereto.

Figure 12E:
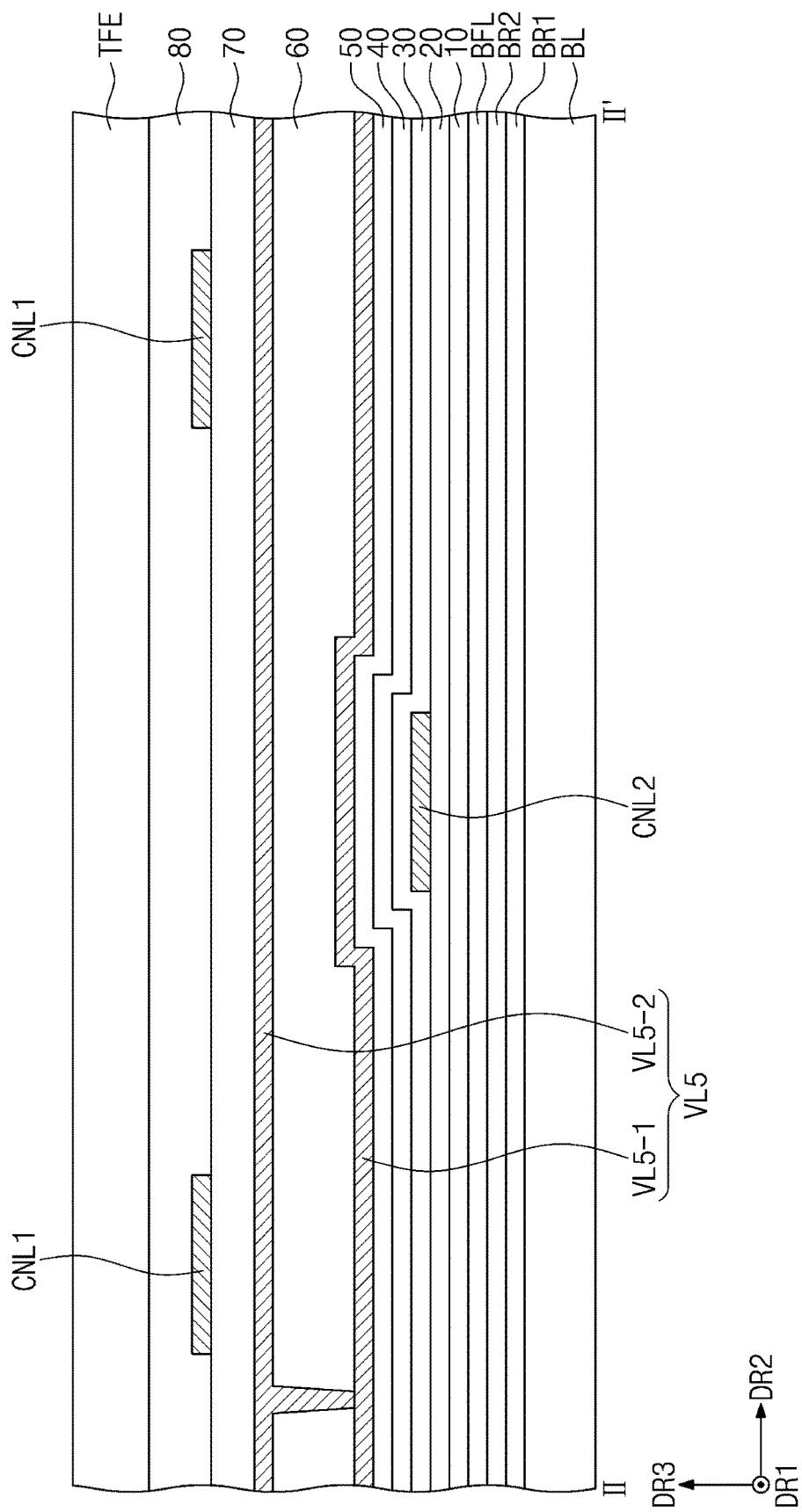
FIG. 12E is a schematic cross-sectional view showing a display panel according to an embodiment as taken along a line II-II' of FIG. 11.

FIG. 12E is a schematic cross-sectional view showing a display panel according to an embodiment as taken along a line II-II' of FIG. 11.

Referring to FIG. 12E, the second connection lines CNL2 may be disposed between the first insulating layer 10 and the second insulating layer 20. The first connection lines CNL1 may be disposed between the seventh insulating layer 70 and the eighth insulating layer 80. The first connection lines CNL1 may have a multi-layer structure in which a titanium layer, an aluminum layer, and a titanium layer are stacked. However, Embodiments are not limited thereto. For example, each of the first connection lines CNL1 may include transparent conducting oxide (TCO).

In FIG. 12A to FIG. 12E, various embodiments of the layer in which the first connection lines CNL1 are disposed and the layer in which the second connection lines CNL2 are disposed are described as an example. In addition to the embodiments as described above, the positions of the layer in which the first connection lines CNL1 are disposed and the layer in which the second connection lines CNL2 are disposed may be variously modified as long as at least one organic layer may be disposed between the first connection lines CNL1 and the second connection lines CNL2.

Figure 13:
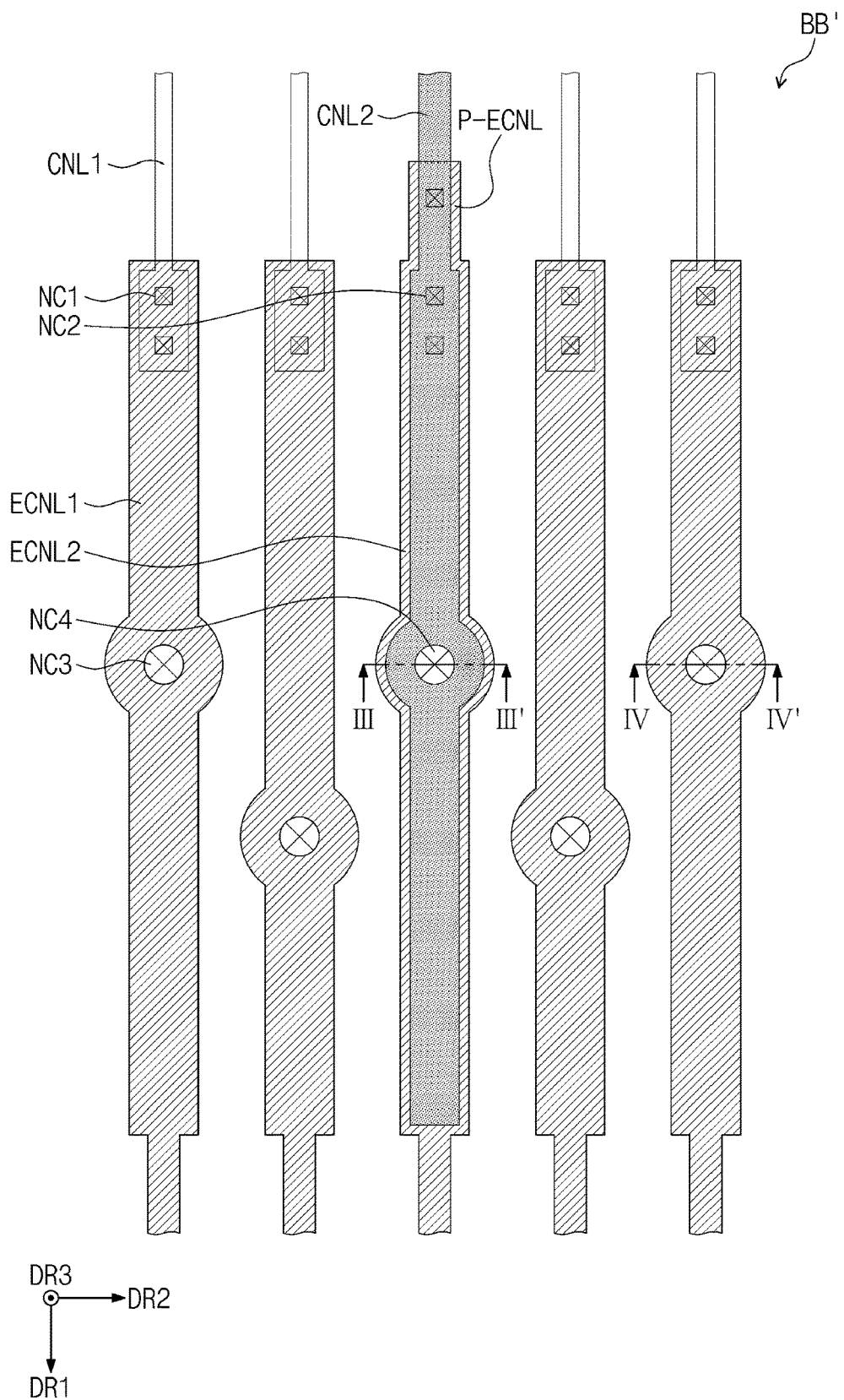
FIG. 13 is an enlarged schematic plan view of an area BB' as shown in FIG. 8.
Figure 14:
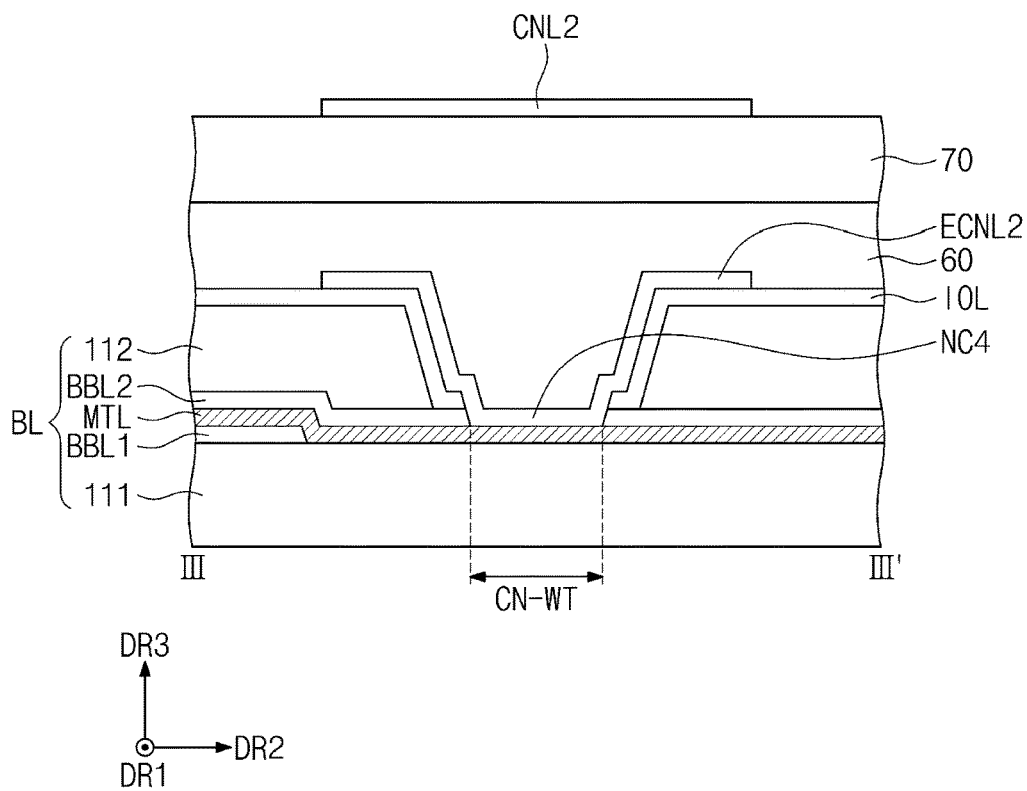
FIG. 14 is a schematic cross-sectional view showing a display panel according to an embodiment as taken along a line III-III' of FIG. 13.
Figure 15:
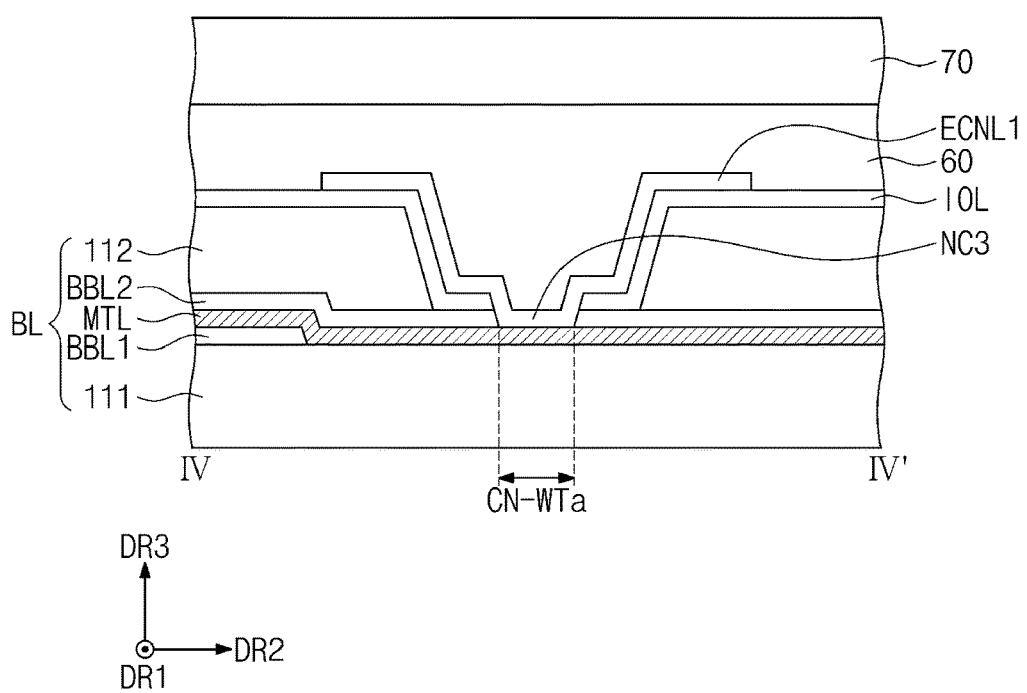
FIG. 15 is a schematic cross-sectional view showing a display panel according to an embodiment as taken along a line IV-IV' of FIG. 13.

FIG. 13 is an enlarged schematic plan view of an area BB' as shown in FIG. 8. FIG. 14 is a schematic cross-sectional view showing a display panel according to an embodiment as taken along a line III-III' of FIG. 13. FIG. 15 is a schematic cross-sectional view showing a display panel according to an embodiment as taken along a line IV-IV' of FIG. 13.

Referring to FIG. 13, FIG. 14, and FIG. 15, each of the first contact lines ECNL1 and each of the first connection lines CNL1 may be connected to each other via at least one first contact NC1. Each of the second contact lines ECNL2 and each of the second connection lines CNL2 may be connected to each other via at least one second contact NC2. The number of the second contacts NC2 may be greater than the number of the first contacts NC1. For example, one first contact line ECNL1 and one first connection line CNL1 may be connected (e.g., electrically connected) to each other via two first contacts NC1. A single contact line ECNL2 and a single second connection line CNL2 may be connected (e.g., electrically connected) to each other via three second contacts NC2. However, this is an example, and the number of the first contacts NC1 and the number of the second contacts NC2 may be equal to each other.

Each of the second contact lines ECNL2 may further include a protruding portion P-ECNL protruding toward the second connection line CNL2. At least one of the second contacts NC2 may be positioned at the protruding portion P-ECNL.

The base layer BL may further include a first sub-barrier layer BBL1 and a second sub-barrier layer BBL2 disposed between the first sub-base layer 111 and the second sub-base layer 112. Each of the first sub-barrier layer BBL1 and the second sub-barrier layer BBL2 may include silicon oxide. However, embodiments are not limited thereto. The conductive layer MTL may be disposed between the first sub-barrier layer BBL1 and the second sub-barrier layer BBL2.

An insulating layer group IOL may be disposed on the base layer BL. The insulating layer group IOL may include inorganic insulating layers. For example, the insulating layer group IOL may include the barrier layers BR1 and BR2, the buffer layer BFL, and the first to fifth insulating layers 10, 20, 30, 40, and 50 as shown in FIG. 6.

An opening may be defined in the second sub-base layer 112 and the insulating layer group IOL. The opening may expose a portion of the conductive layer MTL. Via the opening, the first contact lines ECNL1 and the second contact lines ECNL2 may be connected to the conductive layer MTL. For example, the first contact lines ECNL1 and the second contact lines ECNL2 may be connected to corresponding contacts MCNT (refer to FIG. 9) in a one-to-one manner.

A width CN-WT of the fourth contact NC4 may be equal to or greater than a width CN-WTa of the third contact NC3. As the width CN-WT of the fourth contact NC4 increases, a load due to a contact resistance may be reduced.

In FIG. 13 and FIG. 14, a double line structure in which the second connection line CNL2 extends so as to overlap the second contact lines ECNL2 is illustrated as an example. However, embodiments are not limited thereto. For example, the second connection line CNL2 may extend only to an area where the second contact NC2 is formed, in a similar manner to the first connection line CNL1.

Figure 16:
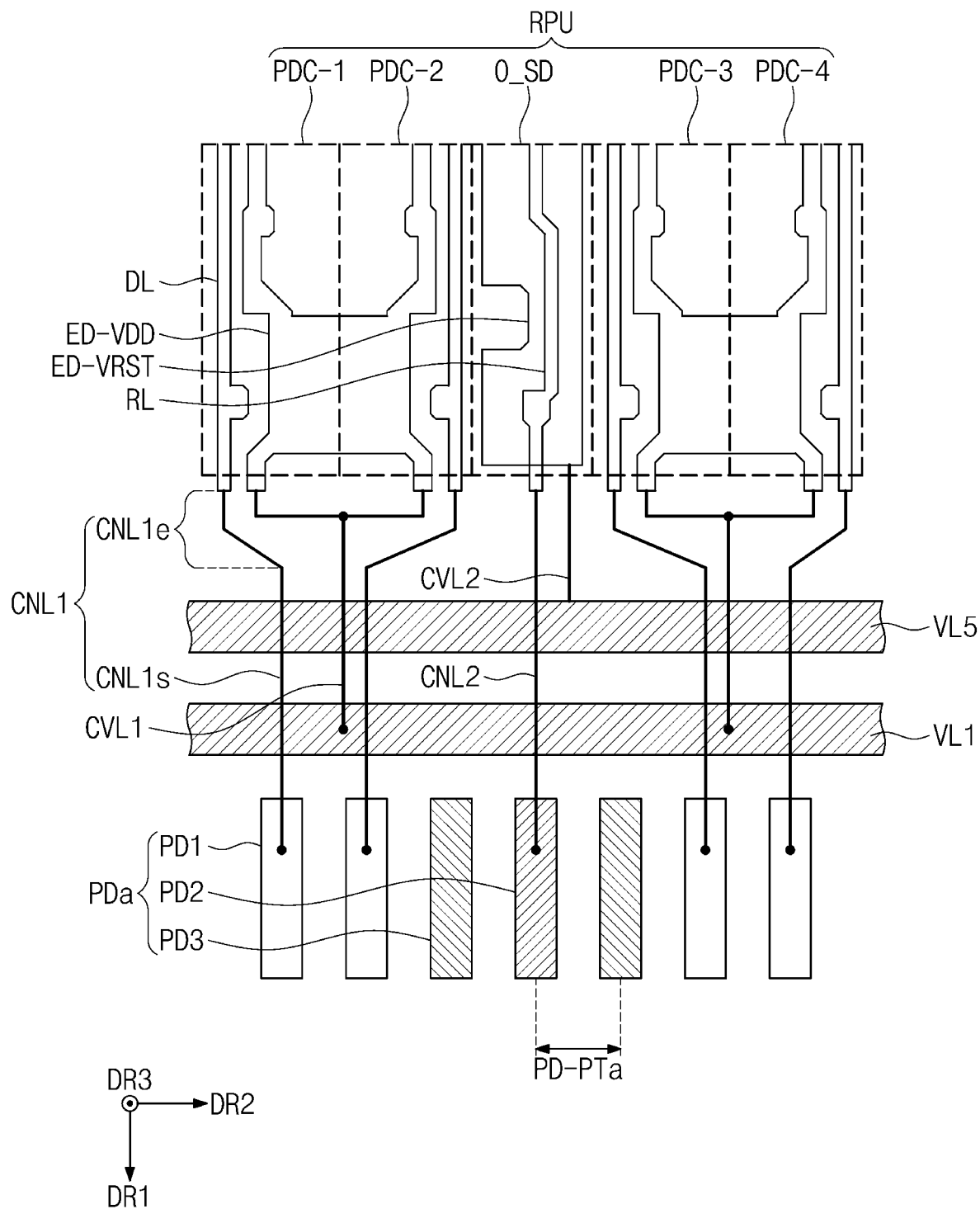
FIG. 16 is a schematic plan view showing some components of a display panel according to an embodiment.

FIG. 16 is a schematic plan view showing some components of a display panel according to an embodiment.

Referring to FIG. 16, pads PDa may be arranged along the second direction DR2. The pads PDa may include first pads PD1, second pads PD2, and third pads PD3. The first to third pads PD1, PD2, and PD3 may be spaced from each other by the same pitch (or same distance) PD-PTa.

The first pads PD1 may be connected (e.g., electrically connected) to the first connection lines CNL1, and the second pads PD2 may be connected (e.g., electrically connected) to the second connection lines CNL2. In an embodiment, at least one third pad PD3 may be disposed between the first pad PD1 and the second pad PD2 adjacent to each other. Referring to FIG. 16, the third pad PD3 may be disposed between the first pad PD1 and the second pad PD2 adjacent to each other as an example. However, embodiments are not limited thereto.

A portion of each of the first connection lines CNL1 and each of the second connection lines CNL2 may have a straight shape extending along the first direction DR1 perpendicular to the arrangement direction of the pads PDa. In case that at least one third pad PD3 is disposed between the first pad PD1 and the second pad PD2 adjacent to each other, a distance in a plan view between the first connection line CNL1 and the second connection line CNL2 adjacent to each other may further increase. Therefore, the coupling between the first connection lines CNL1 and the second connection lines CNL2 may be further reduced. Thus, noise generated in the sensed signal provided to the second connection lines CNL2 may be reduced, and thus, fingerprint sensing sensitivity and fingerprint sensing accuracy may be improved.

The third pads PD3 may be electrically floated pads or electrically grounded pads. In another example, the third pads PD3 may be used as pads to provide other signals. For example, the third pads PD3 may be respectively connected (e.g., electrically connected) to the signal lines 230 as shown in FIG. 4 in use thereof.

Figure 17A:
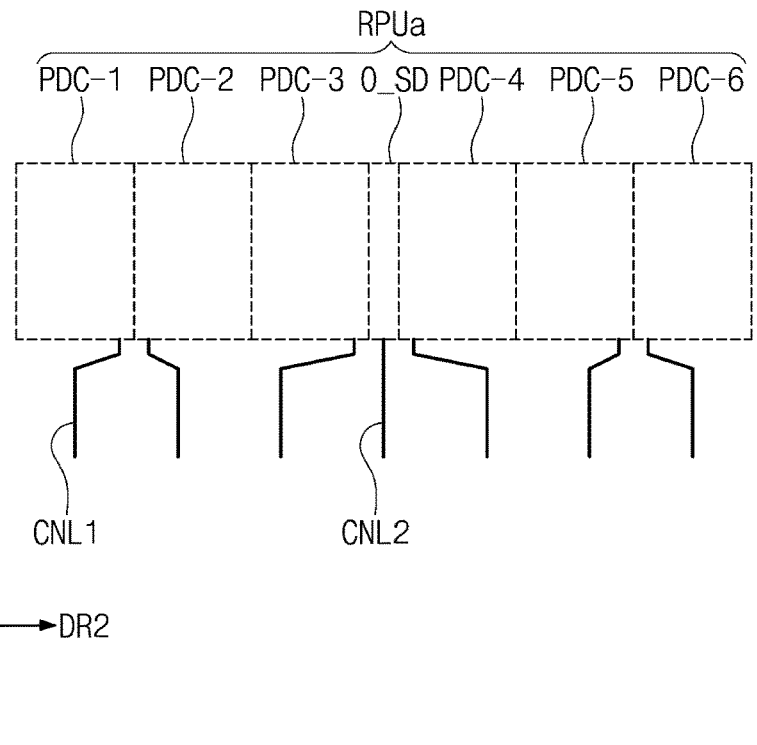
FIG. 17A is a schematic plan view showing some components of a display panel according to an embodiment.

FIG. 17A is a schematic plan view showing some components of a display panel according to an embodiment.

Referring to FIG. 3 and FIG. 17A, the display panel 100 may include repeat units RPUa repeatedly arranged along each of the first direction DR1 and the second direction DR2. FIG. 17A representatively shows a repeat unit (or a single repeat unit) RPUa.

The repeat unit RPUa may include six pixel drive circuits PDC-1, PDC-2, PDC-3, PDC-4, PDC-5, and PDC-6, and the sensor drive circuit O_SD. The sensor drive circuit O_SD may be disposed between a combination of three pixel drive circuits PDC-1, PDC-2 and PDC-3 and a combination of three pixel drive circuits PDC-4, PDC-5 and PDC-6.

Six (6) first connection lines CNL1 respectively extending from the six (6) pixel drive circuits PDC-1, PDC-2, PDC-3, PDC-4, PDC-5, and PDC-6, and one (1) second connection line CNL2 extending from the sensor drive circuit O_SD may be arranged under a rule corresponding to an arrangement rule of the repeat units RPUa. For example, the second connection line CNL2 may be disposed between a combination of six (6) first connection lines CNL1 and a combination of six (6) first connection lines CNL1.

Figure 17B:
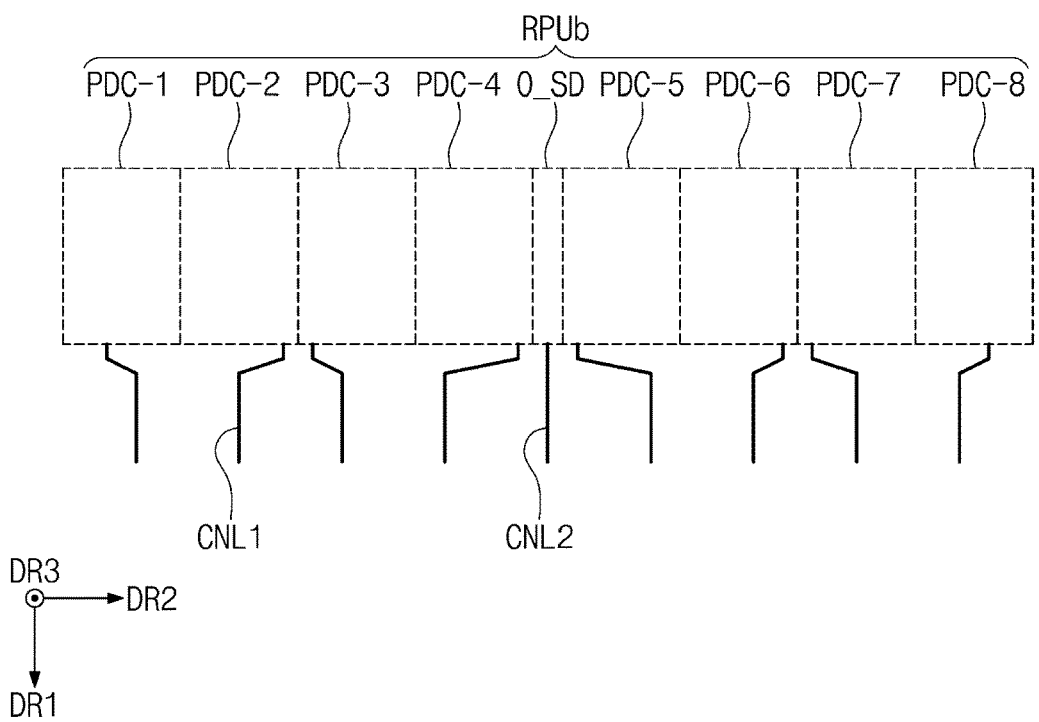
FIG. 17B is a schematic plan view showing some components of a display panel according to an embodiment.

FIG. 17B is a schematic plan view showing some components of a display panel according to an embodiment.

Referring to FIG. 3 and FIG. 17B, the display panel 100 may include repeat units RPUb that are repeatedly arranged along each of the first direction DR1 and the second direction DR2. FIG. 17B representatively shows one repeat unit RPUb.

One (1) repeat unit RPUb may include eight (8) pixel drive circuits PDC-1, PDC-2, PDC-3, PDC-4, PDC-5, PDC-6, PDC-7, and PDC-8, and the sensor drive circuit O_SD. The sensor drive circuit O_SD may be disposed between a combination of four (4) pixel drive circuits PDC-1, PDC-2, PDC-3, and PDC-4 and a combination of four (4) pixel drive circuits PDC-5, PDC-6, PDC-7, and PDC-8.

Eight (8) first connection lines CNL1 respectively extending from the eight (8) pixel drive circuits PDC-1, PDC-2, PDC-3, PDC-4, PDC-5, PDC-6, PDC-7, and PDC-8 and one (1) second connection line CNL2 extending from the sensor drive circuit O_SD may be arranged under a rule corresponding to an arrangement rule of the repeat units RPUb.

The contents as described above with reference to FIG. 8 to FIG. 16 may be similarly applied to the embodiment as shown in FIG. 17A and the embodiment as shown in FIG. 17B. Further, the contents as described above with reference to FIG. 8 to FIG. 16 may be applied to repeat units that may be combined with each other in various ways in addition to the repeat units RPU, RPUa, and RPUb as described in FIG. 11, FIG. 17A, and FIG. 17B.

As described above, the first connection lines may respectively extend from corresponding data lines among the data lines connected to the pixels, and the second connection lines may respectively extend from corresponding read-out lines among the read-out lines connected to the sensors. The second connection lines may extend in a direction perpendicular to the arrangement direction of the first connection lines and the second connection lines. In a plan view, the first connection lines may not overlap the second connection lines. Further, the first connection lines may be disposed in/on a different layer than a layer in/on which the second connection lines are disposed. Accordingly, the coupling between the first connection lines and the second connection lines may be reduced or eliminated. For example, the noise generated in the sensed signal provided to the second connection lines due to a voltage provided via the first connection lines may be reduced. Thus, fingerprint sensing sensitivity and fingerprint sensing accuracy may be improved.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:
   a display panel; and
   a circuit film disposed under the display panel, wherein the display panel includes:
      a base layer;
      a plurality of pixels disposed on the base layer;
      a plurality of sensors disposed on the base layer;
      a plurality of first connection lines disposed on the base layer and electrically connected to the plurality of pixels;
      a plurality of second connection lines disposed on the base layer and electrically connected to the plurality of sensors;
      a plurality of first pads electrically connected to the plurality of first connection lines; and
      a plurality of second pads electrically connected to the plurality of second connection lines,
   the circuit film is electrically connected to the plurality of first pads and the plurality of second pads through an opening of the base layer, and
   each of the plurality of second connection lines has a straight shape extending along a first direction.

2. The display device of claim 1, wherein the plurality of second connection lines are spaced from each other by a same distance.

3. The display device of claim 1, wherein the plurality of first connection lines do not overlap the plurality of second connection lines in a plan view.

4. The display device of claim 1, wherein the plurality of first connection lines include a plurality of straight portions extending along the first direction.

5. The display device of claim 4, wherein the plurality of straight portions of the plurality of first connection lines and the plurality of second connection lines are arranged along a second direction intersecting the first direction and are spaced from each other by a same distance.

6. The display device of claim 4, wherein N straight portions of the plurality of first connection lines, one second connection line of the plurality of second connection lines, and N straight portions of the plurality of first connection lines are sequentially and repeatedly arranged along a second direction intersecting the first direction, where N is a positive integer of 2 or greater.

7. The display device of claim 1, wherein the plurality of second connection lines are disposed on a different layer from a layer on which the plurality of first connection lines are disposed.

8. The display device of claim 1, wherein the display panel further includes a voltage line overlapping the plurality of first connection lines and the plurality of second connection lines.

9. The display device of claim 8, wherein the voltage line is disposed between the plurality of first connection lines and the plurality of second connection lines in a cross-sectional view.

10. The display device of claim 8, wherein
the voltage line includes a first sub-voltage line and a second sub-voltage line electrically connected to each other,
the second sub-voltage line is disposed on a different layer from a layer on which the first sub-voltage line is disposed, and
the plurality of second connection lines are disposed between the first sub-voltage line and the second sub-voltage line.

11. The display device of claim 1, wherein
the base layer includes a first sub-base layer and a second sub-base layer disposed on the first sub-base layer,
the plurality of first pads and the plurality of second pads are disposed between the first sub-base layer and the second sub-base layer, and
a portion of the first sub-base layer is removed to form the opening of the base layer exposing the plurality of first pads and the plurality of second pads.

12. The display device of claim 1, wherein the display panel further includes:
a plurality of first extension lines electrically connected to the plurality of first pads and disposed on a same layer as a layer on which the plurality of first pads are disposed;
a plurality of second extension lines electrically connected to the plurality of second pads and disposed on a same layer as a layer on which the plurality of second pads are disposed;
a plurality of first contact lines electrically connecting the plurality of first extension lines and the plurality of first connection lines to each other; and
a plurality of second contact lines electrically connecting the plurality of second extension lines and the plurality of second connection lines to each other.

13. The display device of claim 12, wherein
the plurality of first contact lines are respectively connected to the plurality of first extension lines via a plurality of first contacts,
the plurality of second contact lines are respectively connected to the plurality of second extension lines via a plurality of second contacts, and
a size of each of the plurality of second contacts is greater than a size of each of the plurality of first contacts.

14. The display device of claim 12, wherein
the plurality of first contact lines and the plurality of second contact lines are disposed on a same layer,
the plurality of first contact lines is disposed on a different layer from a layer on which the plurality of first connection lines are disposed, and
the plurality of second contact lines is disposed on a different layer from a layer on which the plurality of second connection lines are disposed.

15. The display device of claim 1, wherein the plurality of first pads and the plurality of second pads are arranged along a second direction intersecting the first direction and are spaced from each other by a same distance.

16. The display device of claim 1, wherein
the display panel further includes a plurality of third pads disposed on a same layer as a layer on which the plurality of first pads and the plurality of second pads are disposed, and
the plurality of first pads, the plurality of second pads, and the plurality of third pads are arranged along a second direction intersecting the first direction and are spaced from each other by a same distance.

17. An electronic device comprising a display device comprising:
a base layer including a first sub-base layer and a second sub-base layer disposed on the first sub-base layer;
a plurality of pixels disposed on the base layer;
a plurality of sensors disposed on the base layer;
a plurality of first connection lines electrically connected to the plurality of pixels;
a plurality of second connection lines electrically connected to the plurality of sensors;
a plurality of first pads disposed between the first sub-base layer and the second sub-base layer, and respectively electrically connected to the plurality of first connection lines;
a plurality of second pads disposed between the first sub-base layer and the second sub-base layer, and respectively electrically connected to the plurality of second connection lines; and
a circuit film disposed under the base layer and coupled to the plurality of first pads and the plurality of second pads through an opening of the first sub-base layer,
wherein the plurality of second connection lines are spaced from each other by a same distance.

18. The electronic device of claim 17, wherein
each of the plurality of second connection lines has a straight shape extending along a first direction, and
the plurality of first connection lines do not overlap the plurality of second connection lines in a plan view.

19. The electronic device of claim 17, wherein
the plurality of first connection lines respectively include a plurality of straight portions extending along a first direction, and
the plurality of straight portions and the plurality of second connection lines are arranged along a second direction intersecting the first direction and are spaced from each other by a same distance in a plan view.

20. The electronic device of claim 17, further comprising:
a voltage line overlapping the plurality of first connection lines and the plurality of second connection lines in a plan view,
wherein the voltage line is disposed between the plurality of first connection lines and the plurality of second connection lines in a cross-sectional view.

* * * * *